United States Patent [19]
Matsui

[11] Patent Number: 5,905,681
[45] Date of Patent: May 18, 1999

[54] REDUNDANT DECODER UTILIZING ADDRESS SIGNAL AND BURST LENGTH

[75] Inventor: Yoshinori Matsui, Tokyo, Japan

[73] Assignee: NEC Corporation, Tokyo, Japan

[21] Appl. No.: 08/876,293

[22] Filed: Jun. 16, 1997

[30] Foreign Application Priority Data

Jun. 14, 1996 [JP] Japan .................................. 8-175618

[51] Int. Cl.$^6$ .................................................. G11C 7/00
[52] U.S. Cl. ................ 365/200; 365/189.08; 365/230.06
[58] Field of Search .............................. 365/200, 230.06, 365/189.08, 225.7

[56] References Cited

U.S. PATENT DOCUMENTS

| | | | |
|---|---|---|---|
| 5,499,216 | 3/1996 | Yamamoto | 365/230.03 |
| 5,517,458 | 5/1996 | Koshikawa | 365/230.06 |
| 5,621,690 | 4/1997 | Jungroth et al. | 365/200 |
| 5,673,227 | 9/1997 | Engles et al. | 365/200 |

*Primary Examiner*—David Nelms
*Assistant Examiner*—Hien Nguyen
*Attorney, Agent, or Firm*—Young & Thompson

[57] ABSTRACT

The redundancy decoder circuit is capable of receipt of burst length information of address signals for first reading out an address of two addresses to be multi-selected and also judging address to be substituted in accordance with other address to be concurrently read out by means of switching, by the burst length signal, the combination logic of the lower bits of the address already prepared.

8 Claims, 21 Drawing Sheets

| A2 | A1 | A0 | | burst2 | burst4 | burst8 |
|---|---|---|---|---|---|---|
| 1 | 1 | 1 | (7) | Y6P, Y7P | Y7P, Y4P | Y7P, Y0P |
| 1 | 1 | 0 | (6) | Y6P, Y7P | Y6P, Y7P | Y6P, Y7P |
| 1 | 0 | 1 | (5) | Y4P, Y5P | Y5P, Y6P | Y5P, Y6P |
| 1 | 0 | 0 | (4) | Y4P, Y5P | Y4P, Y5P | Y4P, Y5P |
| 0 | 1 | 1 | (3) | Y2P, Y3P | Y3P, Y0P | Y3P, Y4P |
| 0 | 1 | 0 | (2) | Y2P, Y3P | Y2P, Y3P | Y2P, Y3P |
| 0 | 0 | 1 | (1) | Y0P, Y1P | Y1P, Y2P | Y1P, Y2P |
| 0 | 0 | 0 | (0) | Y0P, Y1P | Y0P, Y1P | Y0P, Y1P |

FIG. 12
PRIOR ART

| A2 | A1 | A0 | | burst2 | burst4 | burst8 |
|---|---|---|---|---|---|---|
| 1 | 1 | 1 | (7) | Y6P, Y7P | Y7P, Y4P | Y7P, Y0P |
| 1 | 1 | 0 | (6) | Y6P, Y7P | Y6P, Y7P | Y6P, Y7P |
| 1 | 0 | 1 | (5) | Y4P, Y5P | Y5P, Y6P | Y5P, Y6P |
| 1 | 0 | 0 | (4) | Y4P, Y5P | Y4P, Y5P | Y4P, Y5P |
| 0 | 1 | 1 | (3) | Y2P, Y3P | Y3P, Y0P | Y3P, Y4P |
| 0 | 1 | 0 | (2) | Y2P, Y3P | Y2P, Y3P | Y2P, Y3P |
| 0 | 0 | 1 | (1) | Y0P, Y1P | Y1P, Y2P | Y1P, Y2P |
| 0 | 0 | 0 | (0) | Y0P, Y1P | Y0P, Y1P | Y0P, Y1P |

REDUNDANT DECODER UTILIZING ADDRESS SIGNAL AND BURST LENGTH

BACKGROUND OF THE INVENTION

The present invention relates to a redundant decoder circuit, and more particularly to a redundant decoder circuit to a memory selecting circuit executing continuous accesses by multi-bit pre-fetch. Recently, operating speed of CPU has been on the remarkable increase. On the other hand, a main memory such as dynamic random access memory is slower in operating speed than CPU due to a large capacity of the main memory. For those reasons, a cache memory may be used which is provided between CPU and the main memory. The cache memory is smaller in capacity but much faster in operating or access speed than the main memory. The use of such cache memory realizes a high speed and large capacity memory equivalently. CPU on execution of programs is made to have access to the cache memory. Hit ratios when the cache memory is used may be increased to about 90% so that CPU can fetch data from the cache memory at 90% probability with a requirement for access to the main memory at 10% probability. In accordance with the experimental law that instructions stored at addresses around an address, where the used instruction has been just stored, are likely to be used at a high probability, a currently required instruction is first read out from a designated address for subsequent read out of non-required instructions from addresses different only in lower bit from the above designated address so that both the required and non-required instructions are stored in the cache memory. Therefore, the main memory is capable of allowing that the required data are first read out from the designated address and subsequently non-required data are read out from the addresses different only in lower bit from the designated address. Nibble mode access or 2-bit pre-fetch access have been known as the sequential accesses. Notwithstanding, those accesses need many data latch circuits and buses. It is also difficult to make sequential accesses from an odd address.

In the Japanese laid-open patent publication No. 6-146349, it is disclosed that a memory selective circuit is provided for n-bit pre-fetch sequential accesses wherein a plurality of column lines are multiply selected, each of which is to select only an address of data to be outputted in one output timing.

In the above system, upon receipt of information of input address and burst length which means a length of data to be sequentially outputted, a column selective line corresponding to the input address and another column selective line corresponding to another address of data to be outputted are multiply selected.

As described above, in the conventional system, the single column selective line can select only an address of data to be outputted in one output timing, for which reason even if the plural column selective lines are currently selected and a pre-fetch system is utilized to output data separately in plural times, then it is possible to combine optionally data to be pre-fetched. There is no limitation to the order in outputting the data. For those reasons, it is possible to make sequential accesses from the odd address.

The above memory selecting circuit will further be described in more detail. The memory selecting circuit is provided with a pre-fetch decoder for decoding lower bits of the column address. The pre-fetch decoder receives not only an address but also information which indicates burst length for supplying a column decoder with a pre-decode address to activate two bits of the address. The column decoder then receives the pre-decode address and the remaining higher bits of the column address to select concurrently two column selective lines connected to memory cells from which data are required to be read out, so that the data corresponding to the two time outputs are concurrently read out.

FIG. 1 is a circuit diagram illustrative of a conventional 16M-bit DRAM 1000 integrated on a semiconductor chip. The 16M-bit DRAM 1000 has a 16M-bit memory cell array 101 which has 4096 word lines and 512 column selective lines (CSL0–CSL511) so that one address corresponds to 8 memory cells and 8 bits signals are dealt with. The 16M-bit DRAM 1000 also has an address buffer 102 for receiving address informations and a row decoder 103 connected to the address buffer 102 for receiving the address signal from the address buffer 102 to decode the received address signal. The row decoder 103 is also connected to the memory cell array 101 for supplying the decoded address signals to the memory cell array to read out the data stored at the address in the memory cell array.

The 1.6 M-bit DRAM 1000 also has a pre-fetch decoder 1004 connected to the address buffer 102 for receiving column addresses (A0–A8) and controlling multiple selections of the column selective lines. The 16M-bit DRAM 1000 further includes a pre-decoder 105 connected to the pre-fetch decoder 1004 and a column decoder 106 also connected to the pre-fetch decoder 1004. The pre-decoder 105 and the column decoder 106 are connected to each other. The column decoder 106 is connected through a sense amplifier 114 to the memory cell array 101. The 16M-bit DRAM 1000 further includes a clock generator 107 for generating clock signals to control the timings of the pre-fetch decoder 1004 The sense amplifier 114 is connected through a latch circuit 111 to an input/output switch 108. The input/output switch 108 is connected to an output buffer 109 and an input buffer 110.

The read out operation is made as follows. The address buffer 102 receives input addresses A0–A11 as row addresses to supply the received row addresses A0–A11 to the row decoder 103 and also to supply the received addresses A0–A8 as column addresses to the pre-fetch decoder 1004.

The row decoder 103 then decodes the received row addresses A0–A11 to select one of the 4096 word lines in accordance with the decoded row addresses A0–A11. The pre-fetch decoder 1004 supplies YAD3–YAD8 as higher bits of the column addresses A0–A8 to the pre-decoder 105 and also pre-decode the lower bits A0–A2 to output pre-decoded addresses Y0–Y7. The operations of the pre-fetch decoder 1004 are controlled by signals LOAD0, LOAD1, LOAD2, COUNT and COUNT2 supplied from the clock generator 107. LOAD0 is a signal generated by the clock generator 107 in response to rising of a clock signal CLK from an external device. LOAD1 and LOAD2 are signals generated in synchronizes with the clock signals CLK when the signals supplied from external device are write command and read command.

COUNT and COUNT2 are signals generated in correspondence to the burst length after LOAD1 and LOAD2 have been generated. Although the clock generator generates other control signals, those control signals are not relative to the present invention, for which reason the descriptions about those signals will be emitted.

The decoded signals outputted from the pre-decoder 105 and the pre-decoded address from the pre-fetch decoder 1004 are supplied to the column decoder 106 whereby the column decoder 106 can select the column selective line CSL.

The above pre-fetch decoder 1004 receives burst signals B4 and B8 which indicate the burst lengths so that the pre-fetch decoder 1004 can, in accordance with those received burst signals B4 and B8, output pre-decode addresses where two bits of those addresses are in the active level, so as to select an address corresponding to the input address and another address of data to be outputted subsequently. The column decoder 106, therefore, receives the decoded signals outputted from the pre-decoder 105 and the pre-decode addresses having two bits being in the active level whereby the two column selective lines are concurrently selected.

The 16M-bit DRAM 1000 in addition includes an even address redundancy decoder 1112 and an odd address redundancy decoder 1113, both of which operate to substitute a defective memory cell with redundancy memory when an address of the defective memory cell is selected, for those purpose each of the even address redundancy decoder 1112 and the odd address redundancy decoder 1113 is connected to the pre-fetch decoder 1004 and also connected through the sense amplifier 114 to the memory cell array 101. Each of the even address redundancy decoder 1112 and the odd address redundancy decoder 1113 have been programmed by fuse-trimming so as to judge whether or not the address for input is an address to be substituted. If the address is to be substituted, then inhibition signals RED0 and RED1 are generated to inhibit selection of the column selective line and further redundancy column selective lines RYS0 and RYS1 are activated to select redundancy cells.

The even address redundancy decoder 1112 receives inputs of YAD3–YAD8 as the lower bits of the column addresses and also receives inputs of even pre-decode pre-addresses Y0P, Y2P, Y4P and Y6P as the pre-decoded lower bits A0–A2, whilst the odd address redundancy decoder 1113 receives inputs of YAD3–YAD8 as the lower bits of the column addresses and also receives inputs of odd pre-decode pre-addresses Y01P, Y3P, Y5P and Y7P as the pre-decoded lower bits A0–A2.

Since each of the column selective lines CSL is connected to eight memory cells as described above, if two column selective lines CLS are selected, this means that data stored in the sixteen memory cells are concurrently read out as 16-bit data.

The read out 16-bit data are then latched by the latch circuit 111 before those data are supplied to the input/output switch 108.

Further, the pre-fetch decoder 1004 supplies the input/output switch 108 with a signal CI0 which designates which column selective line should be read-out operated to read out data from memory cells connected to the indicated one of the column selective lines, so that the input/output switch 108 selects latched data from the memory cells connected to the designated one of the column selective lines in accordance with the CI0 signal prior to outputting the selected data to the output buffer 109.

The above read-out operation of cell data is made if the redundancy column selective lines RYS0 and RYS1 are selected in place of the column selective lines CSL inhibited to be activated.

The output buffer 109 outputs the data as output data D0–D7 of the 16M-bit DRAM. During the output of the output data D0–D7 from the output buffer 109, the pre-decode address is changed in accordance with the COUNT2 signal from the clock generator 107 to select other column selective line for read-out operations.

The outlines of the operations of the 16M-bit DRAM are as described above. The subsequent descriptions will focus on operation of the individual elements of the 16M-bit DRAM.

FIG. 2 is a circuit diagram illustrative of circuit configurations of the pre-fetch decoder 1004 in the conventional 16M-bit DRAM. The pre-fetch decoder 1004 comprises an address latch generator block 280 and a pre-decode block 290.

The address latch generator block 280 receives the column addresses A0–A8 and generates internal address signals YAD0–YAD2 based upon the lower bits A0–A2 and also generates internal address signals YAD3–YAD8 based upon the higher bits A3–A8 which are, however, represented by "Ai" in FIG. 2.

The pre-decode block 290 receives the internal address signals YAD0–YAD2 to generate pre-decode addresses Y0–Y7 and pre-decode pre-addresses Y0P–Y7P. The pre-decode block 290 has latch circuits 600–602 and a selective signal generator circuit 603.

The latch circuit 600 comprises nine latch circuits 600-0 through 600-8 wherein the latch circuits 600-3 through 600-8 receive the column addresses A3–A8 respectively. In FIG. 2, the latch circuits 600-3 through 600-8 are represented by "600-$i$". Also the latch circuit 601 comprises nine latch circuits 601-0 through 601-8 wherein the latch circuits 601-3 through 601-8 receive the column addresses A3–A8 from the latch circuits 600-3 through 600-8 respectively. In FIG. 2, the latch circuits 601-3 through 601-8 are represented by "601-$i$".

The latch circuits 600, 601 and 602 fetch data after the LOAD0 signal, the LOAD1 signal and the LOAD2 signal have been activated respectively.

The latch circuits 602-1 and 602-2 are supplied with the COUNT2 signal so that integrated counter circuits perform count-up operations, in response to the COUNT2 signal, of address data A1 and A2 fetched in response to the activation of the LOAD2 signal.

The burst signal B8 is a signal which indicates that the burst length is "8" in high level "1". When the burst signal B8 is in high level, a carry from the latch circuit 602-1 to 602-2 or from A1 to A2 is made in accordance with the logic with reference to output signals INT1 from the latch circuit 602-1.

Also the burst signal B4 is a signal which indicates that the burst length is "4" in high level "1". If the burst signals B4 and B8 are in the low level, then this means that the burst length is "2".

The selective signal generator circuit 603 is supplied with the COUNT signal so that data stored in the selective signal generator circuit 603 are inverted whenever the COUNT signal is activated.

FIG. 3 is a circuit diagram illustrative of a circuit configuration of a column decoder in the conventional 16M-bit DRAM. The column decoder 106 comprises 64 switch circuits 106-0 through 106-63, each of which is commonly supplied with the pre-decode addresses Y0–Y7 from the pre-fetch decoder 1004 as well as supplied with decoded signals outputted from the pre-decoder 105.

FIG. 4 is a fragmentary circuit diagram illustrative of a circuit configuration of a pre-decoder 105 in the conventional 16M-bit DRAM. YADX and YADY mean column addresses YAD3 and YAD4 or YAD5 and YAD6 or YAD7 and YAD8. The three sets of the column addresses are decoded into AX0AY0, AX1AY0, AX0AY1 and AX1AY1. The decoded signals are then inputted into the column decoder 106 so that the column decoder 106 receives both those decoded signals and the pre-decode addresses Y0–Y7 to select the column selective line CSL.

FIG. 5 is a circuit diagram illustrative of a circuit configuration of a switch circuit 106-k in the column decoder 106 in the conventional 16M-bit DRAM. The switch circuit 106-k has p-channel MOS transistors 1500–1503 and 1507 as well as n-channel MOS transistors 1504–1506 and 1509.

Decoded signals A3xA4y, A5xA6y, A7xA8y from the pre-decoder 105 are inputted into gates of the transistors 1502, 1504, and gates of the transistors 1501 and 1505 as well as gates of the transistors 1500 and 1506. When the decoded signals A3xA4y, A5xA6y, A7xA8y are activated into high level "1" the n-channel MOS transistors 1504 and 1506 turn ON so that a line 1530 has a potential of Vss(0).

As a result, the pre-decode addresses Y0–Y7 are outputted through buffer circuits 1521-0 through 1521-7 respectively.

When at least one of the decode outputs A3xA4y, A5xA6y, A7xA8y is in low level "0", then the buffer circuits 1521-0 through 1521-7 output "0".

FIG. 6 is a circuit diagram illustrative of a circuit configuration of the even address redundancy decoder circuit 1112 in the conventional 16M-bit DRAM. In the even address redundancy decoder circuit 1112, programming is made for even address to be substituted where the lowest bit YAD0 of the column address is "0". The even address redundancy decoder circuit 1112 has fuse elements 1200-0 through 1200-15 cut by laser trimming so that programming of the address to be substituted is made.

The fuses 1200-4 through 1200-15 are used for programming of the lower bits YAD3–YAD8 of the column address. The fuses 1200-4 through 1200-15 are connected to drains of the n-channel MOS transistors 1201-4 through 1201-15 whose gates are applied with the corresponding address signals or inverted signals thereof, so that if the address logic is "1" corresponding to the substituting address YAD3, then the fuse 1200-5 is cut. If the address logic is "0", then the fuse 1200-4 is cut. The programming for the addresses YAD4–YAD8 are executed similarly.

The fuses 1200-0 through 1200-3 are used for programming of the lower bits YAD0–YAD2 of the column address. The fuse 1200-0 through 1200-3 are respectively connected to drains of the n-channel MOS transistors 1201-0 through 1201-3 whose gates are applied with re-decode pre-addresses Y0P, Y2P, Y4P and Y6P so that if the lower bit of the column address corresponds to the substituting address Y0P, then the fuse 1201-0 is cut. The programming for the addresses Y2P, Y4P and Y6P are executed similarly.

A signal PRE is a pre-charge signal generated by the clock generator 107 in response to the variation of the internal address signal. The low level corresponds to the active level which causes the p-channel transistor 1219 to turn ON for judging of substituting address to the input of the new column address signals YAD0–YAD8.

If the address signals YAD3–YAD8 inputted into the even address redundancy decoder 1112 and the pre-decode pre-addresses Y0P, Y12P, Y4P and Y6P correspond to the addresses to be substituted, then the fuses corresponding to the logic value of the respective address bits are cut whereby a current path for discharging the line 1220 turns OFF.

The line 1220 is therefore charged into high level so that the selective signal RED0 for inhibiting selection of the column selective line becomes low level whilst the redundancy selective line RYS0 becomes high level.

If, however, address signals YAD3–YAD8 inputted into the even address redundancy decoder 1112 and the pre-decode pre-addresses Y0P, Y12P, Y4P and Y6P do not correspond to the addresses to be substituted, then the fuse corresponding to any of the address bits is not cut and the current path for discharging the line 1220 remains ON, for which reason the signal PRE is unable to charge the line 1220 and the line 1220 is in the low level. The selective signal RBD0 for inhibiting selection of the column selective line becomes high level whilst the redundancy selective line RYS0 becomes low level.

FIG. 7 is a circuit diagram illustrative of a circuit configuration of the odd address redundancy decoder circuit 1113 in the conventional 16M-bit DRAM. In the odd address redundancy decoder circuit 1113, programming is made for odd address to be substituted where the lowest bit YAD0 of the column address is "1" to control signals RED1 inhibiting selections of the column selective line and redundancy column selective line RYS1 selecting the redundancy cell.

FIG. 8 is a circuit diagram illustrative of a circuit connection of the column selective lines, the redundancy column selective lines RYS0 and RYS1 and bit lines. Each of the column selective line is connected only a pair of the bit lines. The adjacent pairs of the bit lines are connected to either different I/O buses 1600 and 1601 alternately.

For the 2-bit pre-fetch, the paired bit lines connected to one of the I/O buses 1600 and 1601 are selected so that 2-bit data are latched by the latch circuit.

The redundancy column selective lines RYS0 and RYS1 are connected to pairs of the bit lines respectively and connected to the different I/O buses 1600 and 1601 respectively. The redundancy column selective line RYS0 is for CSL8k, CSL8k+2, CSL8k+4, and CSL8k+6 whilst the redundancy column selective line RYS1 is for CSL8k+1, CSL8k+3, CSL8k+5, and CSL8k+7. Since actually the data width is "8", eight input/output terminals are provided. Nevertheless, only two pairs of the input/output buses 1600 and 1601 are illustrated in FIG. 8 although the sixteen pairs of the input/output buses are provided actually. In FIG. 8, the column selective line is connected to only one pair of the bit lines, even actually the column selective line is further connected to bit lines connected to other input/output buses so that the column selective line is connected to the eight pairs of the bit lines.

With reference back to FIG. 2, the read out operations will be described to focus on the operations of the pre-fetch decoder 1004 assuming that input addresses A2, A1 and A0 are "0", "1" and "1" whenever the burst length is 2, 4 or 8.

When the burst length is 2, the read out operation will be described with reference to FIGS. 2 and 23.

The column addresses A0–A8 supplied from the address buffer 102 are latched by the latch circuit 600 in response to the LOAD0 signal. Namely, the addresses A2, A1 and A0 are latched in the latch circuits 600-2, 600-1 and 600-0 to store "0", "1" and "1" respectively so that "0", "1" and "1" are supplied to the internal address signals IA2, IA1 and IA0 Read command of combinations of chip select (SCB), row address strobe (RASB), column address strobe (CASB) and write enable (WEB) s supplied whereby the signal LOAD0 and LOAD1 are activated so that the internal address signals IA0–IAi are latched by the latch circuits 601, 602 and 603 in accordance with LOAD1.

FIG. 9 is a circuit diagram illustrative of a circuit configuration of latch circuit 601-0.

Since the burst signals B4 and B8 are "0", then output form an OR-gate 700 is "0", for which reason even if the signal LOAD1 is activated, then YAD0 remains "0".

Logic "1" of the internal address signal is supplied to an output INT0 in accordance with the LOAD1. Logic "1" of the INTA0 is stored in he selective signal generator circuit 603 in accordance with the LOAD2.

FIG. 10 is a circuit diagram illustrative of a circuit configuration of latch circuits 601-1 and 602-1. Logic "1" of the internal address signal IA1 is stored in the latch circuits 601-1 and 602-1 in accordance with LOAD1 and LOAD2 whereby logic "1" is supplied to the column address signal YAD1.

FIG. 11 is a circuit diagram illustrative of a circuit configuration of latch circuits 601-2 and 602-2. Logic "0" of the internal address signal IA2 is stored in the latch circuits 601-2 and 602-2 in accordance with LOAD1 and LOAD2 whereby logic "0" is supplied to the column address signal YAD2.

In the pre-fetch decoder 1004, since the burst signals B4 and B8 are "0", the switches 629 and 630 are in OFF and the nodes 633 and 634 remains "1".

As described above, since the signals "YAD2, YAD1 and YAD0 are supplied with "0", "1" and "0", the pre-decode addresses Y2P and Y3P are "1" and the remaining pre-decode addresses are "0".

Whether the pre-decode address is a substituting address or not is judged by the even address redundancy decoder 1112 and the odd address redundancy decoder 1113.

If the pre-decode address is the substituting address, then the signal RED0 or RED1 is "0" and further the pre-decode addresses Y0, Y2, Y4 and Y6 or Y1, Y3, Y5 and Y7 are "1".

Since the pre-decode address is activated by logic "0", the selection of the column selective address is inhibited.

If, however, the pre-decode address is not the substituting address, then signals RED0 and RED1 are "1" and the pre-decode addresses Y2 and Y3 are "0" and the remaining pre-decode addresses are "1".

In accordance with the pre-decode addresses, the corresponding column selective lines or RYS0 and RYS1 are selected so that 16-bit data are latched in the latch circuit and then supplied to the input/output switch 108.

Since the selective signal CIO is "1", 8-bit data are selected from the selected column selective line corresponding to Y3P of the pre-decode addresses or 8-bit data read out in accordance with RYS1 are selected to be supplied to the output buffer 109.

When the burst length is 2, after the LOAD1 signal has been generated, the COUNT signal is generated by the clock generator 107 in synchronization with the clock signals.

In accordance with the COUNT signal, the selective signal CIO is inverted into "0" so that 8-bit data are selected from the column selective line corresponding to the signal Y2P of the pre-decode address or 8-bit data read out in accordance with the RYS0 are selected to be supplied to the output buffer 109.

As a result, the output of data are made in the order of " ... 011"(=3), " ... 010"(=2).

When the burst length is 4, the read out operation will be described with reference to FIGS. 2 and 24. In this case, the burst signal B4 is "1" and the burst signal B8 is "0".The switches 629 and 631 are in ON and the switches 630 and 632 are in OFF.

In the latch circuit 601-0, since the burst signal B4 is "1", the logic "1" of the internal address signal IA0 is supplied to the column address signal YAD0. The selective signal generator circuit 603 and other latch circuits store the same data as when the burst length is "2".

The pre-decode addresses Y0P and Y3p are "1" and the others are "0". Similarly when the burst length is 2, the pre-decode addresses are judged to be substituted or not by the even address redundancy decoder 1112 and the odd address redundancy decoder 1113 to decide high or low level of the RED0, RED1, RYS0 and RYS1.

Data read out by the pre-decode addresses are latched by the latch circuits. In accordance with the signal CIO supplied to the input/output switch 108, data from the column selective line CSL corresponding to the pre-decode address Y3P are selected or 8-bit data read out from the redundancy column selective line RYS1 are selected for supply to the output buffer 109.

After the LOAD1 and LOAD2 signals are been generated, the signal COUNT is generated tree times by the clock generator circuit 107 in synchronization with the clock signals wherein after 2 clocks have been supplied, the signal COUNT2 is generated one time.

When the COUNT signal is generated one time, the selective signal CIO is inverted into "0" so that the output is changed into the data from the column selective line CSL corresponding to the pre-decode address Y3P or 8-bit data read out from the redundancy column selective line RYS1.

Subsequently when the signals COUNT and COUNT2 are generated, the logic YAD1 is inverted into "0" by a flip-flop circuit 840 in the latch circuit 602-1.

In the latch circuit 602-2, the burst signal B8 is "0" , for which reason the output of the AND-gate 926 is "0" and the logic of the YAD2 is not inverted.

As a result, the pre-decode addresses Y1P and Y2P are "1" and the others are "0". In this case, the selective signal CIO is inverted two times and returned into "1", for which reason the input/output switch 108 selects the data from the column selective line CSL corresponding to the pre-decode address Y1P or 8-bit data read out from the redundancy column selective line RYS1.

The final signal COUNT has been generated, the selective signal CIO is inverted into "0". The input/output switch 108 selects the data from the column selective line CSL corresponding to the pre-decode address Y2P or 8-bit data read out from the redundancy column selective line RYS0.

Consequently, first the pre-decode addresses Y0P and Y3P are "1", and then when the COUNT2 is generated, then the pre-decode addresses Y1P and Y2P are "1".

Data read out from the column selective line corresponding to the Y3P are first supplied to the output buffer 109. Every when the signal COUNT is generated, data read out from the column selective lines corresponding to the Y0P, Y1P and Y2P are supplied to the output buffer 109.

In view of the column address, data are outputted in the order of " ... 011"(=3), " ... 000"(=0), " ... 001"(=1), " ... 010"(=2).

When the burst length is 8, the burst signal B8 is "1". The switches 629 and 631 are OFF whilst the switches 630 and 632 are in ON. The pre-decode addresses Y3P and Y4P are "1" and the others are "0".

When the logic of the internal address signal INT1 is "1", the logic of the YAD2 is also inverted in response to the generation of the COUNT2 signal by the latch circuit 602-2 for counting up operations.

After the LOAD1 and LOAD2 signals have been generated, the signal COUNT is generated seven times by the clock generator circuit 107 in synchronization with the clock signals. The COUNT2 signal is generated three times every two clocks. The pre-decode address is made into "1" every when the COUNT2 signal is generated, for which reason the pre-decode addresses are changed in the order of Y5P and Y6P, Y7P and Y8P and Y0P and Y1P.

Data read out from the column selective line corresponding to Y3P are first supplied to the output buffer 109. Every when the COUNT signal is generated, data read out from the column selective limes corresponding to Y4P, Y5P, Y6P, Y7P, Y0P, Y1P, Y2P are supplied to the output buffer 109.

In view of the column address, data are outputted in the order of " ... 011"(=3), " ... 100"(=4), " ... 101"(=5), " ... 110"(=6), " . . . 111"(=7), " . . . 000"(=0), " . . . 001"(=1), " ... 010"(=2).

FIG. 12 is a table indicating how the pre-decode pre-addresses are outputted by the pre-fetch pre-decoder 1004 in accordance with the input addresses A0–A8. The pre-decoder pre-address on the table means address of the logic "1".

In the above conventional system, the address signals which should be first read out are supplied to the pre-fetch pre-decoder 1004 for receipt of the burst length information to generate address signals which should be concurrently read out, each of which is combination of even address and odd address. The combination is decided in accordance with the burst length.

Whether or not the each address is to be substituted is judged by the even address redundancy decoder and the odd address redundancy decoder in accordance with the pre-decode signals from the pre-fetch pre-decoder.

FIG. 13 is a timing chart of pre-decode pre-address and the pre-decode address for selecting the column selective line CSL when the input addresses A2, A1 and A0 are "0", "1", and "1"(=3) and the burst length is 4.

When the address signals YAD2, YAD1 and YAD0 are supplied, the pre-decode addresses Y3P and Y0P are "1", provided that the even address corresponding to the Y0P is a substituting address and the odd address has been substituted in the former step where the Y1P was selected and the odd address corresponding to the Y3p is not substituting address.

When the Y0P comes "1", the pre-decode signal Y0 is once activated into "0" before the substituting address is recognized by the even address redundancy decoder whereby the inhibition signal for inhibiting selection of the column selective line becomes "0" so that Y0 is returned into "1".

When the Y3P becomes "1", the substituting address is recognized by the odd address redundancy decoder whereby the inhibition signal for inhibiting selection of the column selective line becomes "1" so that Y3 is activated into "0".

In order to finalize the pre-decode signal for selecting the column selective line, it takes a time to generate the judgement signal by the redundancy decoder after the pre-decode pre-address has been generated.

The above necessary time is in the range of 1–2 nanoseconds in the DRAMs currently on the development. This causes a timing delay to limit the access speeds.

SUMMARY OF THE INVENTION

Accordingly, it is an object of the present invention to provide a redundancy decoder circuit for memory selective circuits in order to improve high speed access by shortening the necessary time for finalizing the pre-decode signal which selects the column selective line.

The above and other objects, features and advantages of the present invention will be apparent from the following descriptions.

In accordance with the present invention, the redundancy decoder circuit is capable of receipt of burst length information of address signals for first reading out an address of two addresses to be multi-selected and also judging the address to be substituted in accordance with the other address to be concurrently read out by means of switching, by the burst length signal, the combination logic of the lower bits of the address already prepared.

Judgement of the substituting address is not carried out in accordance with the pre-decode signal outputted from the pre-fetch pre-decoder. The judgement of the substituting address is made in accordance with the address signal to be first read out, therefore the time for generating the judgement signal is shortened.

BRIEF DESCRIPTIONS OF THE DRAWINGS

Preferred embodiments according to the present invention will be described in detail with reference to the accompanying drawings.

FIG. 12 is a table indicating how the pre-decode pre-addresses are outputted by the pre-fetch pre-decoder 1004 in accordance with the input addresses A0–A8. The pre-decoder pre-address on the table means address of the logic "1".

FIG. 16 is a table indicating how the pre-decode pre-addresses are outputted by the pre-fetch pre-decoder 104 in accordance with the input addresses A0–A2.

PREFERRED EMBODIMENTS

A first embodiment according to the present invention will be described. In accordance with the present invention, the redundancy decoder circuit is capable of receipt of burst length information of address signals for first reading out an address of two addresses to be multi-selected and also judging the address to be substituted in accordance with the other address to be concurrently read out by means of switching, by the burst length signal, the combination logic of the lower bits of the address already prepared.

Judgement of the substituting address is not carried out in accordance with the pre-decode signal outputted from the pre-fetch pre-decoder. The judgement of the substituting address is made in accordance with the address signal to be first read out, for which reason the time is shortened until the judgement signal is generated by the redundancy decoder. The column address signals YAD0–YAD8 generated by the pre-fetch pre-decoder are inputted into the redundancy decoder.

Figure 1:
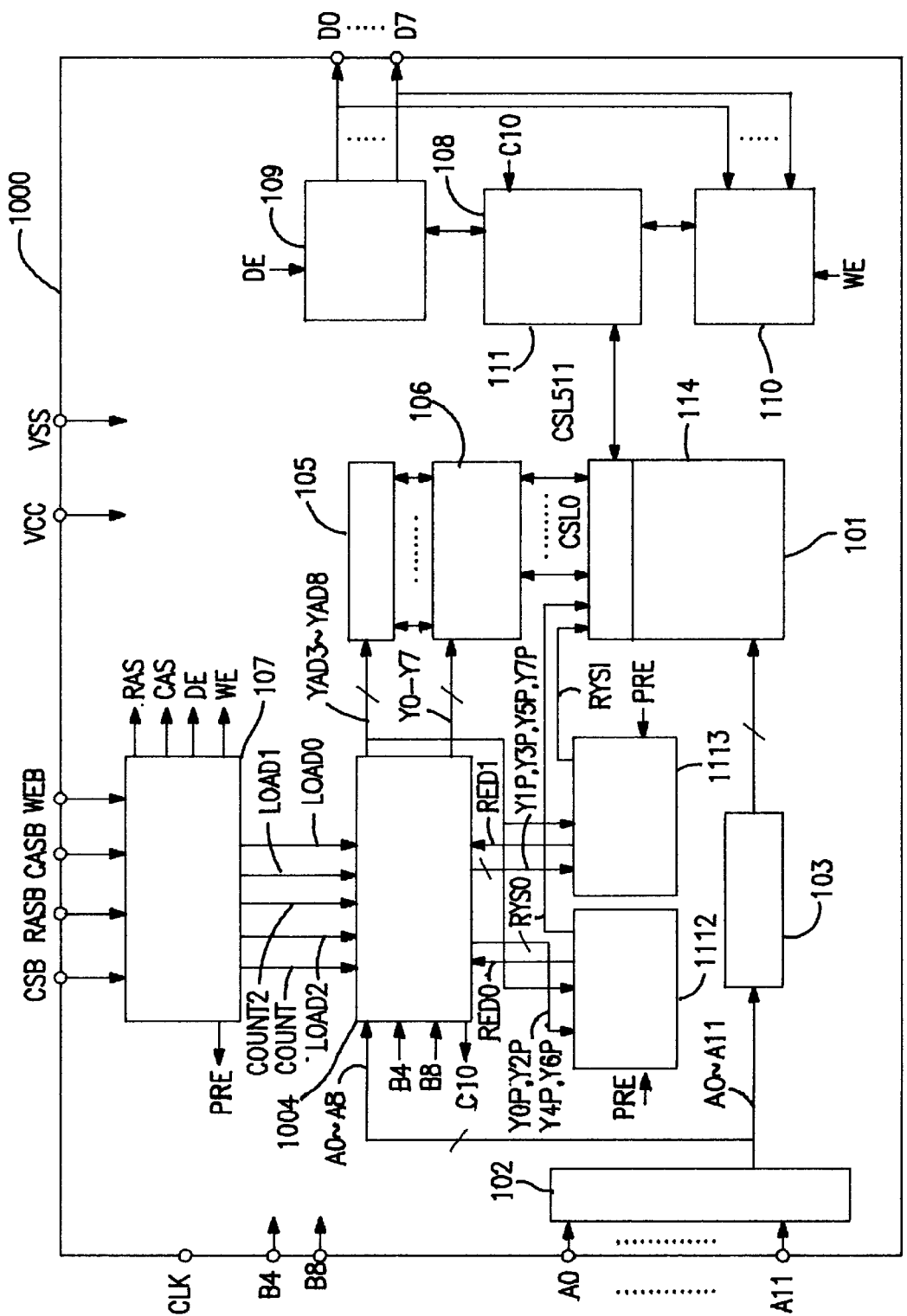
FIG. 1 is a circuit diagram illustrative of a conventional 16M-bit DRAM 1000 integrated on a semiconductor chip.
Figure 2:
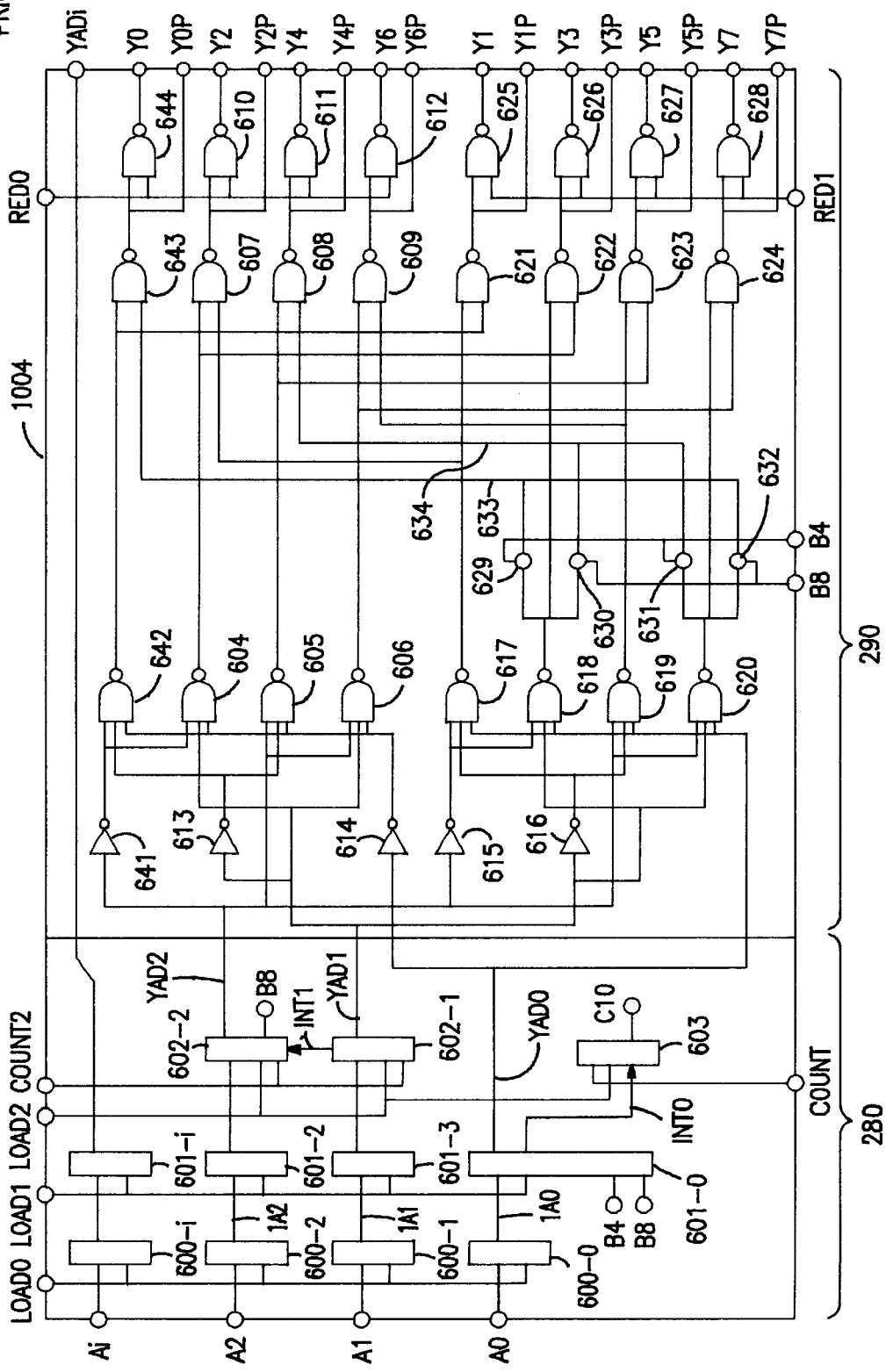
FIG. 2 is a circuit diagram illustrative of circuit configurations of the pre-fetch decoder 1004 in the conventional 16M-bit DRAM.
Figure 4:
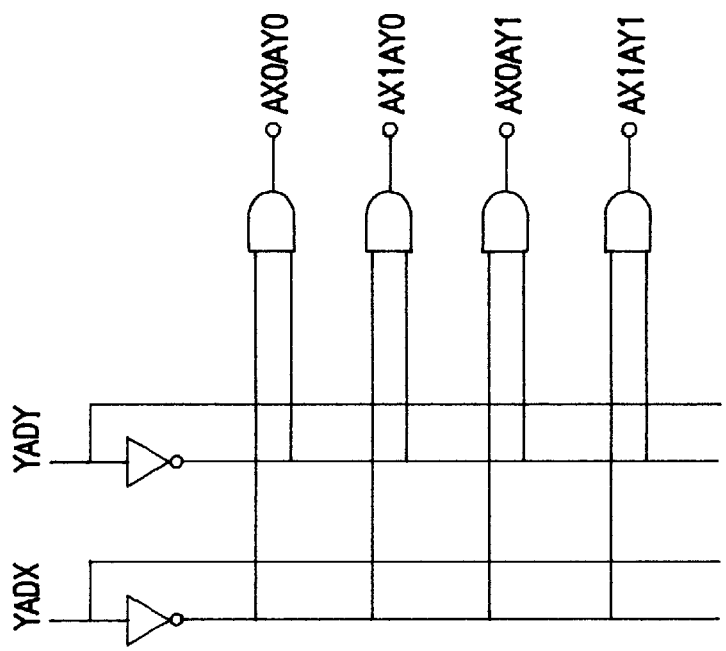
FIG. 4 is a fragmentary circuit diagram illustrative of a circuit configuration of a pre-decoder 105 in the conventional 16M-bit DRAM.
Figure 3:
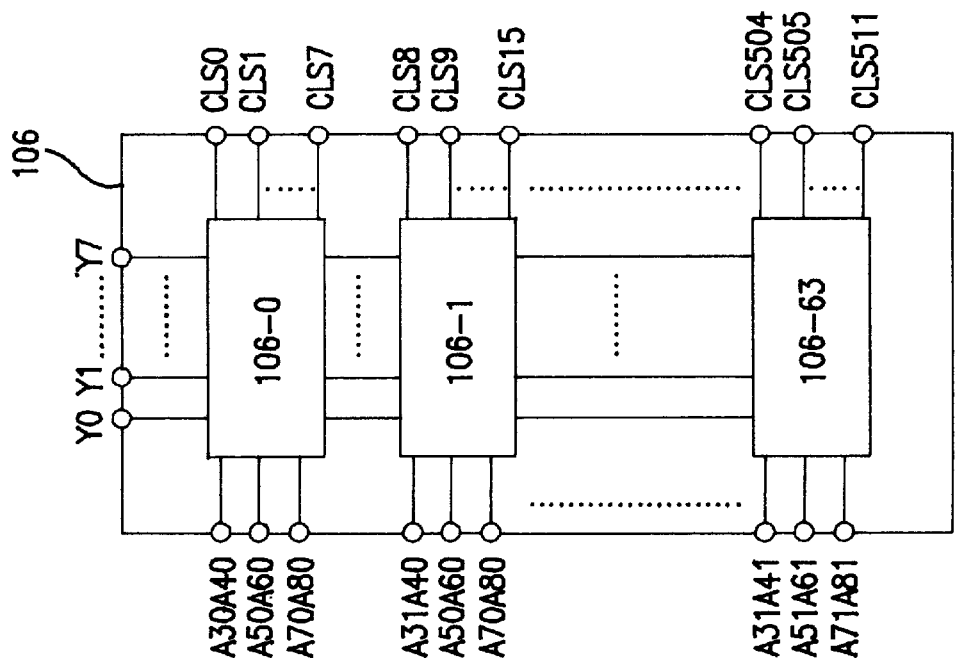
FIG. 3 is a circuit diagram illustrative of a circuit configuration of a column decoder in the conventional 16M-bit DRAM.
Figure 5:
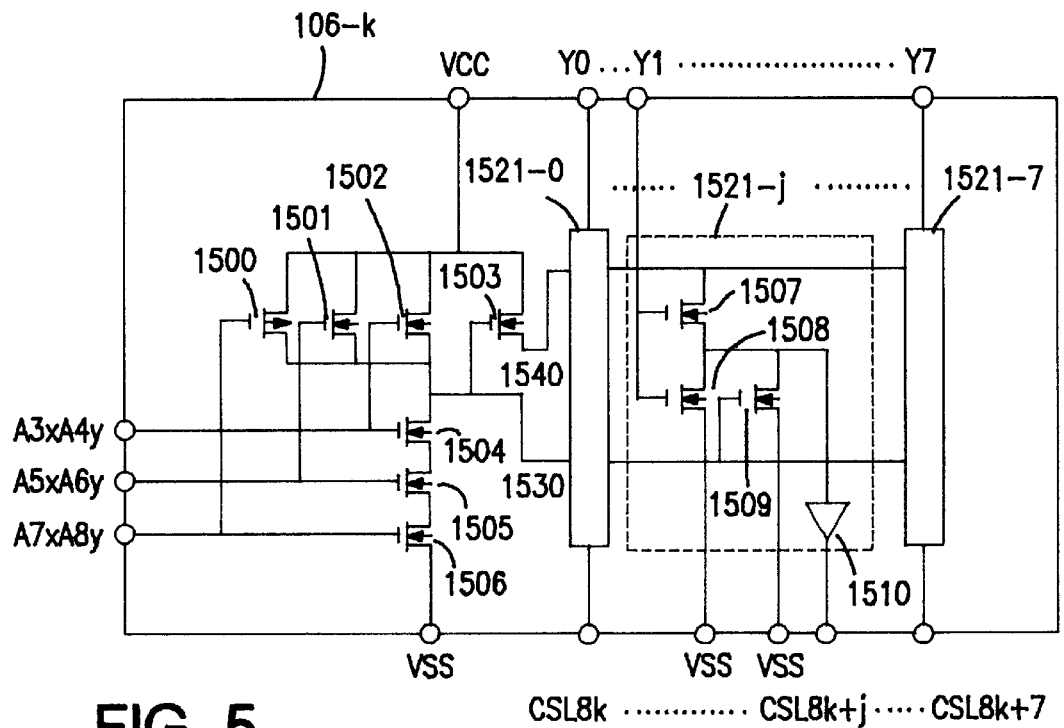
FIG. 5 is a circuit diagram illustrative of a circuit configuration of a switch circuit 106-k in the column decoder 106 in the conventional 16M-bit DRAM.
Figure 9:
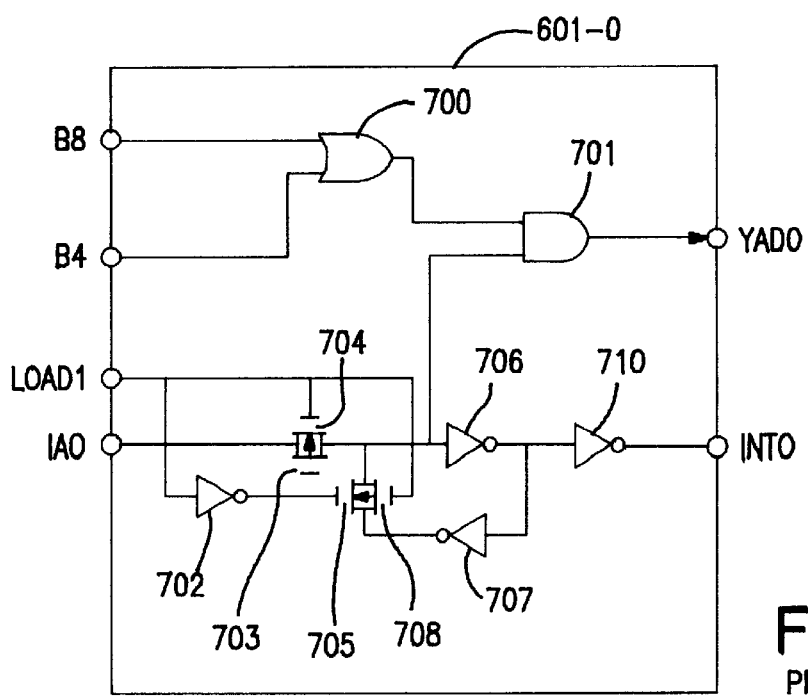
FIG. 9 is a circuit diagram illustrative of a circuit configuration of latch circuit 601-0.
Figure 6:
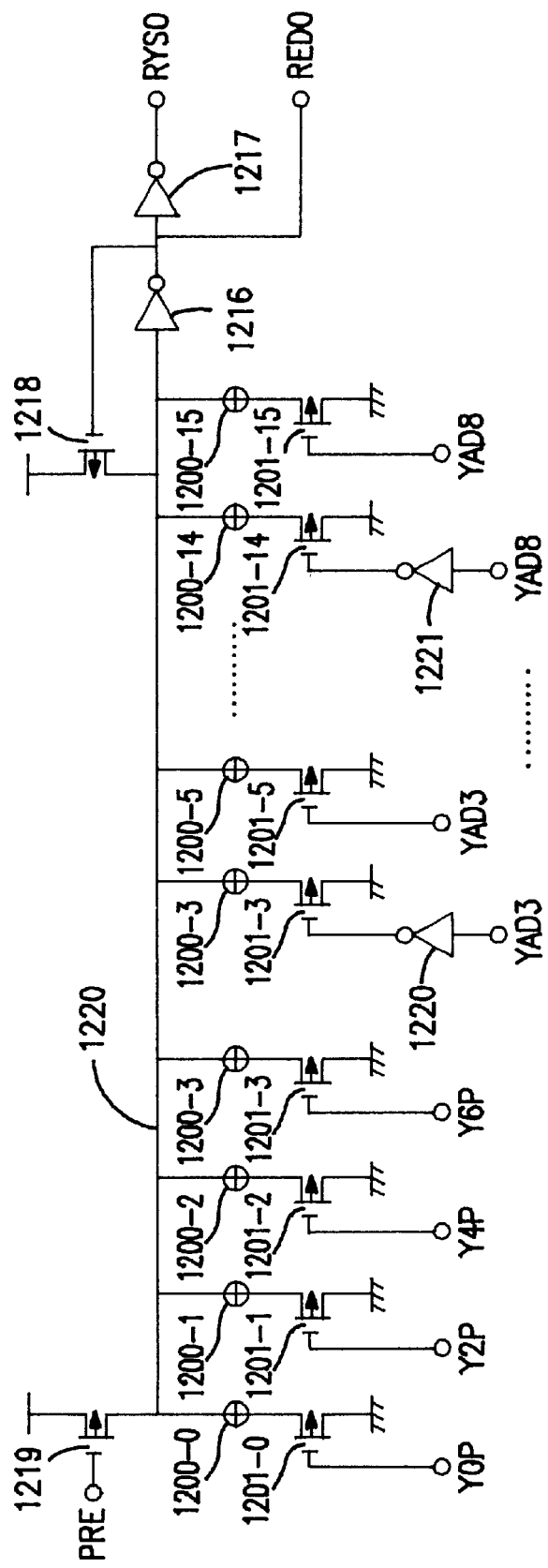
FIG. 6 is a circuit diagram illustrative of a circuit configuration of the even address redundancy decoder circuit 1112 in the conventional 16M-bit DRAM.
Figure 7:
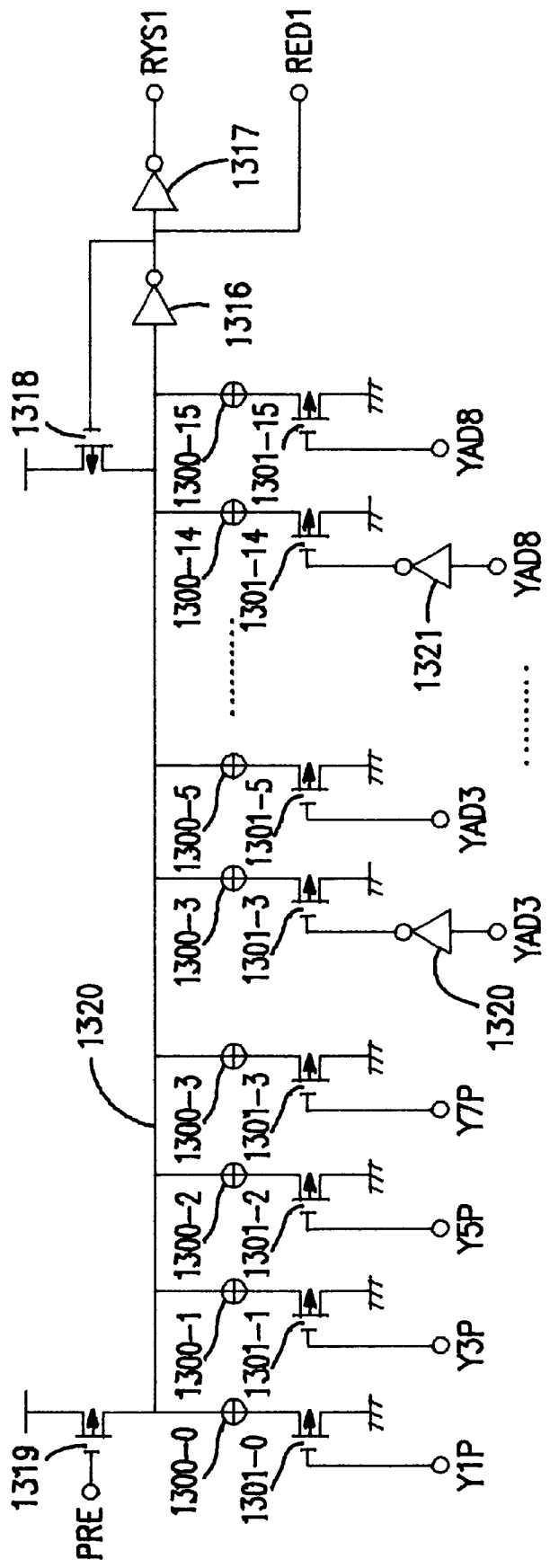
FIG. 7 is a circuit diagram illustrative of a circuit configuration of the odd address redundancy decoder circuit 1113 in the conventional 16M-bit DRAM.
Figure 8:
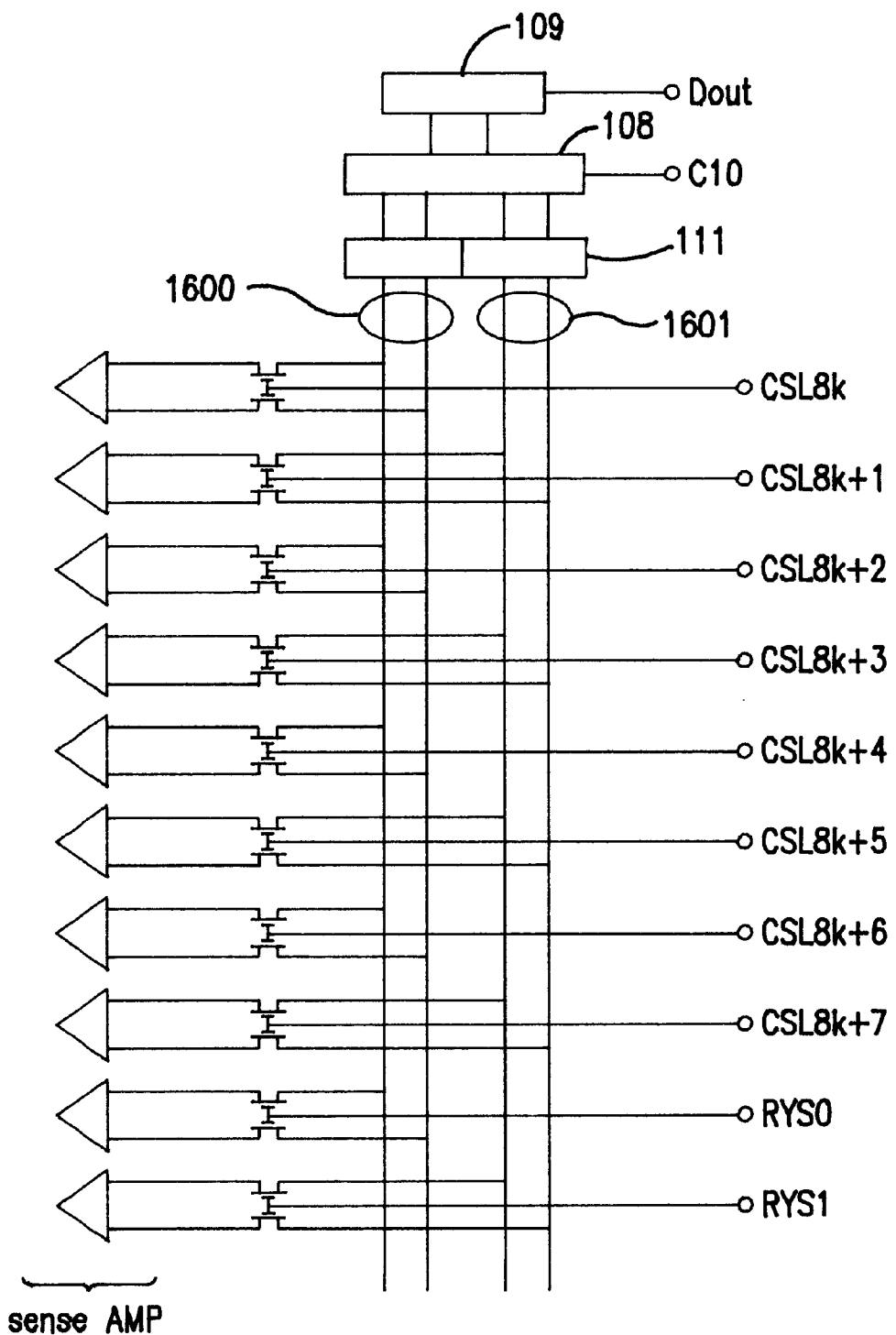
FIG. 8 is a circuit diagram illustrative of a circuit connection of the column selective lines, the redundancy column selective lines RYS0 and RYS1 and bit lines.
Figure 10:
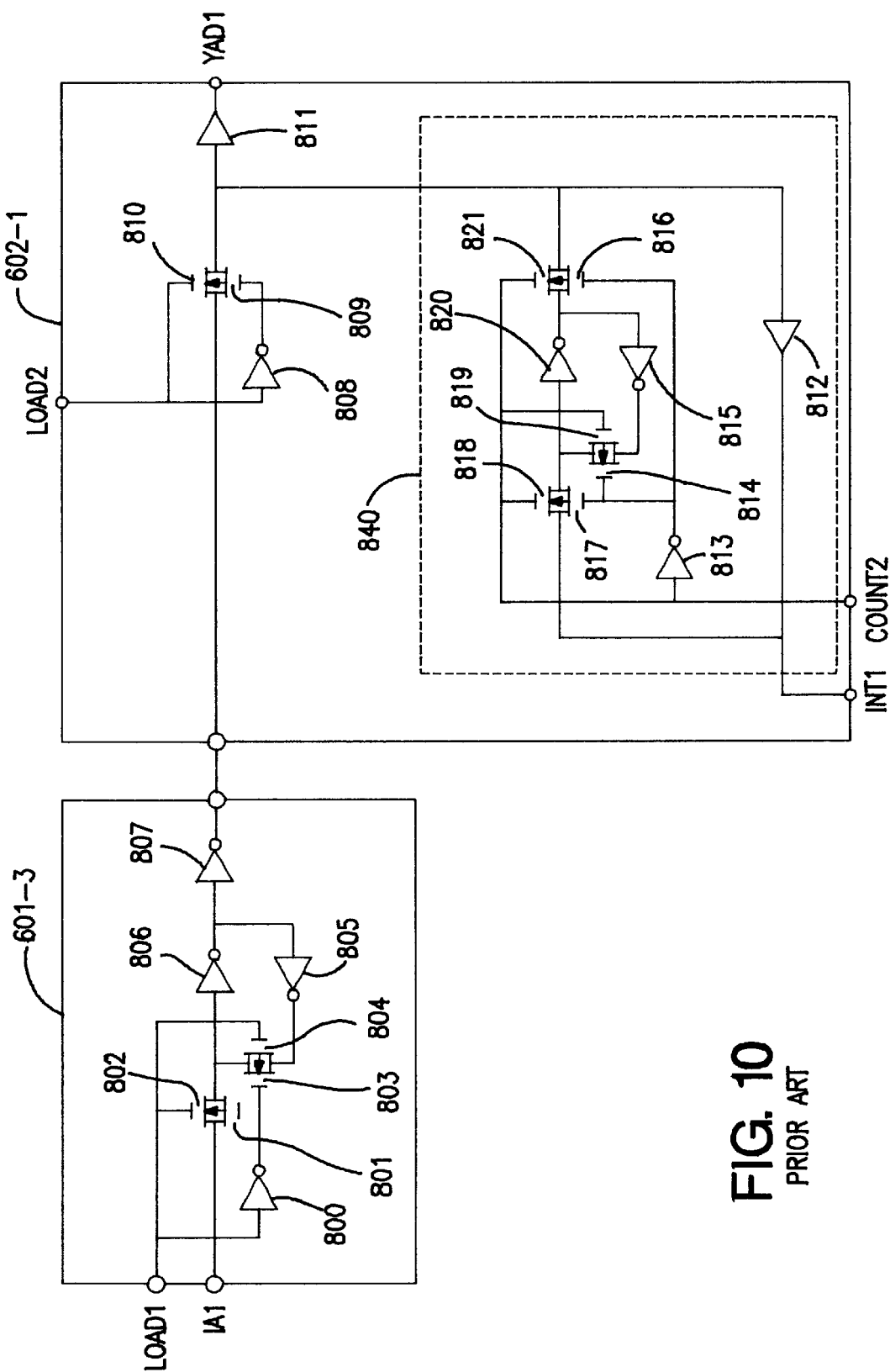
FIG. 10 is a circuit diagram illustrative of a circuit configuration of latch circuits 601-1 and 602-1.
Figure 11:
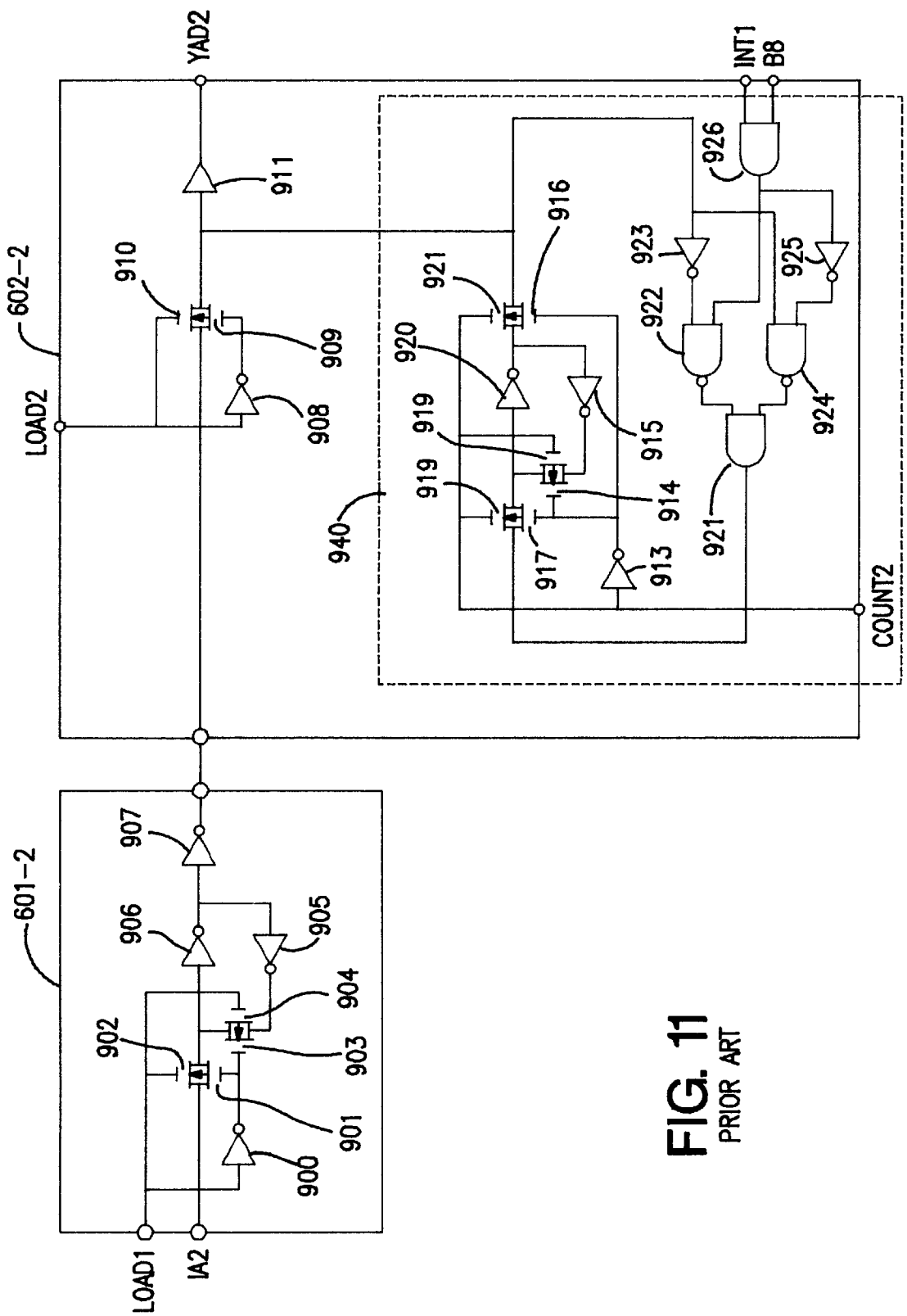
FIG. 11 is a circuit diagram illustrative of a circuit configuration of latch circuits 601-2 and 602-2.
Figure 13:
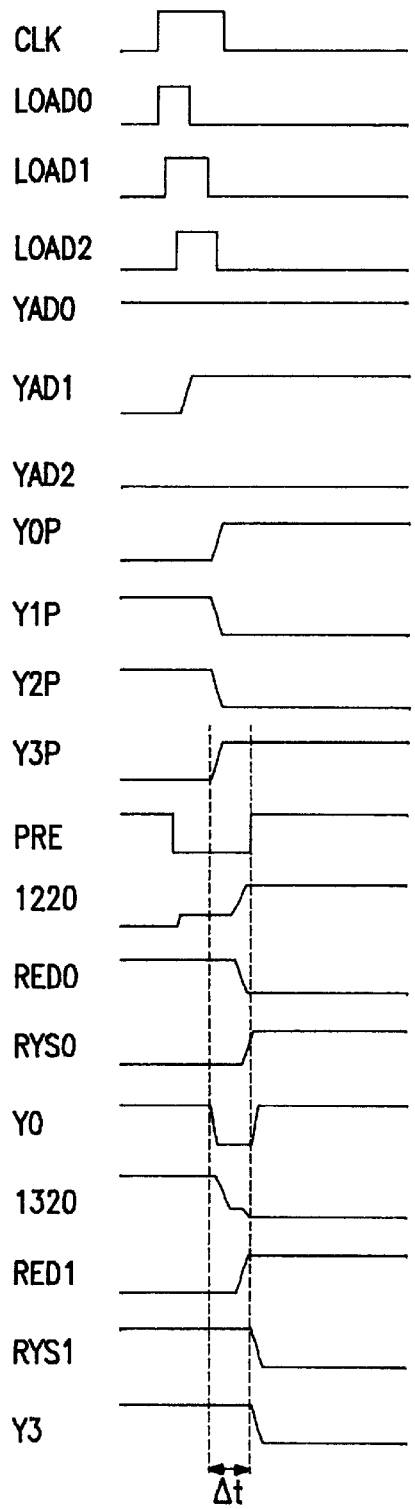
FIG. 13 is a timing chart of pre-decode pre-address and the pre-decode address for selecting the column selective line CSL when the input addresses A2, A1 and A0 are "0", "1", and "1"(=3) and the burst length is 4.
Figure 14:
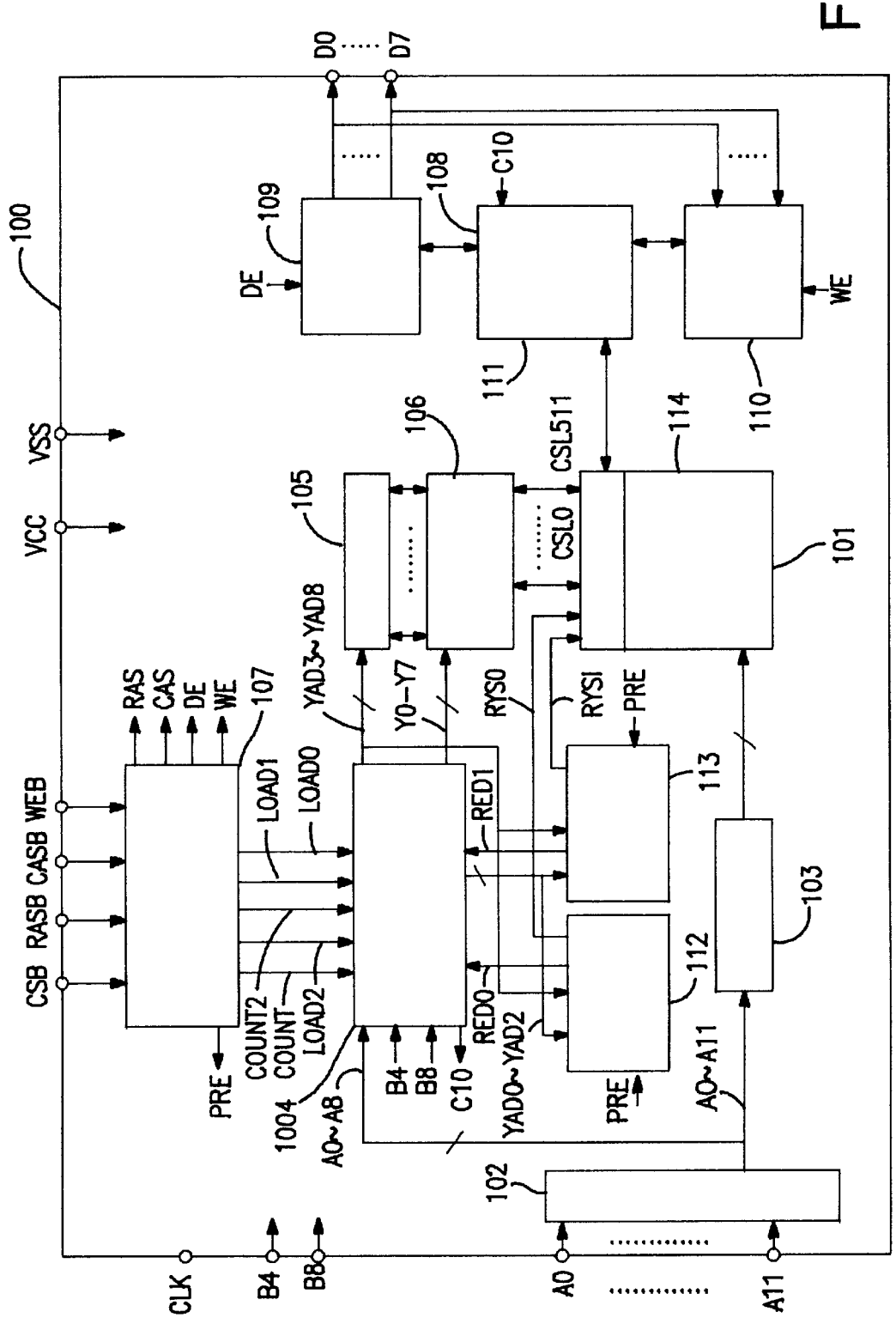
FIG. 14 is a circuit diagram illustrative of a novel 16M-bit DRAM 100 integrated on a semiconductor chip in accordance with the present invention.

FIG. 14 is a circuit diagram illustrative of a novel 16M-bit DRAM 100 integrated on a semiconductor chip in accordance with the present invention. The circuit configuration is different from that in FIG. 1 only in that the column address signals YAD0–YAD8 are supplied to the even and odd redundancy decoders 112 and 113. The other circuit configurations and operations are the same as in the conventional one described above.

Figure 15:
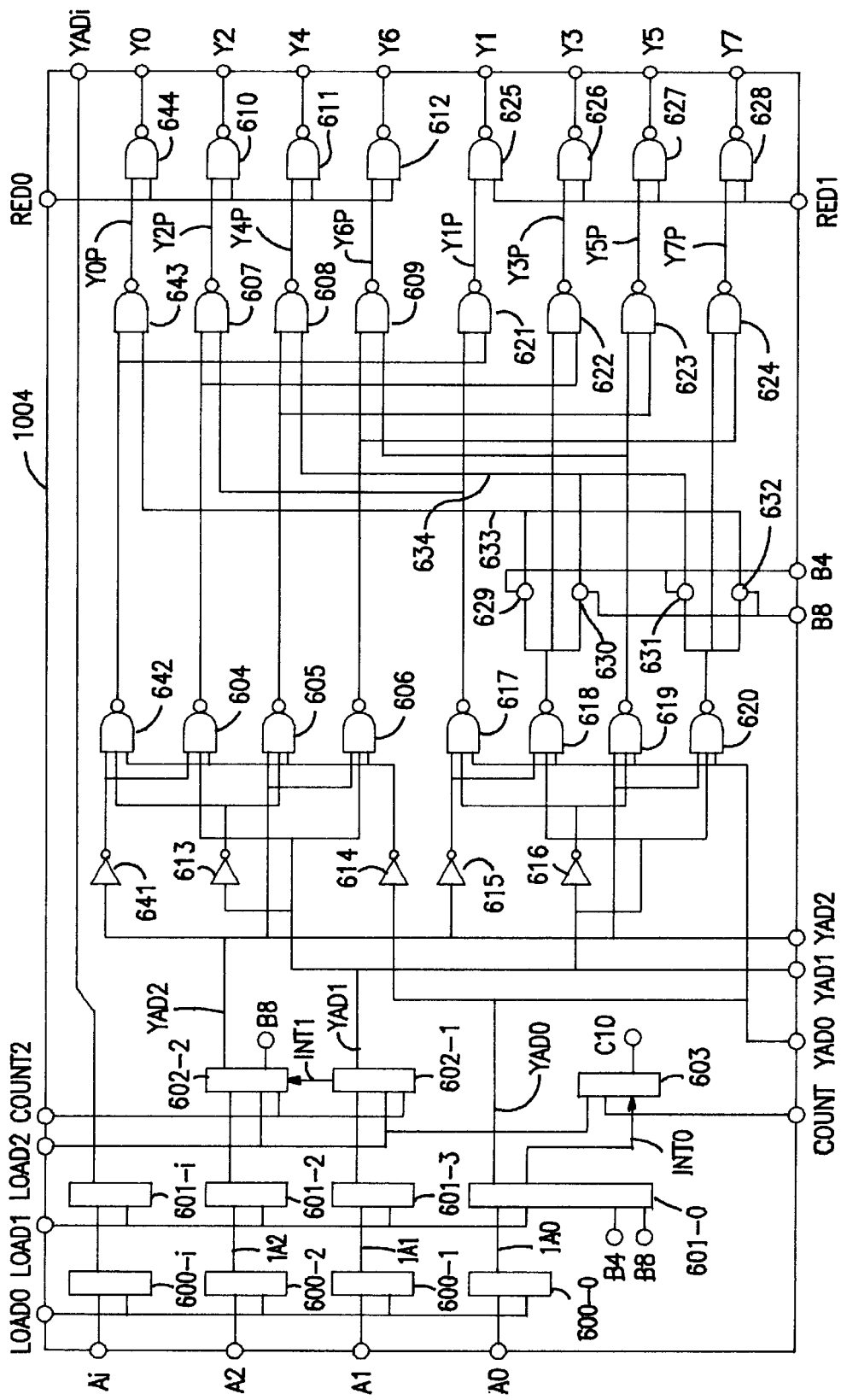
FIG. 15 is a circuit diagram illustrative of a pre-fetch decoder 104 in this embodiment.

FIG. 15 is a circuit diagram illustrative of a pre-fetch decoder 104 in this embodiment.

FIG. 16 is a table indicating how the pre-decode pre-addresses are outputted by the pre-fetch pre-decoder 104 in accordance with the input addresses A0–A2. The multiple selected column addresses are combinations of the even and odd addresses.

When the address to be first read out is the even address, then the further address to be concurrently read out is different only in the lowest bit YAD0 from the above address whilst the YAD1 and YAD2 are the same.

If, however, the address to be firset read out is the odd address, then the further address to be concurrently read out is different depending upon the burst length and generated by the combination with the above address signal.

Namely, logic bits corresponding to the odd address YAD1 and YAD2 are always the same as the column addresses YAD1 and YAD2.

When the column addresses to be supplied are the even addresses, then logic bits corresponding to the address YAD1 and YAD2 are always the same as the column addresses YAD1 and YAD2 but are determined by the burst length and the address.

Figure 17:
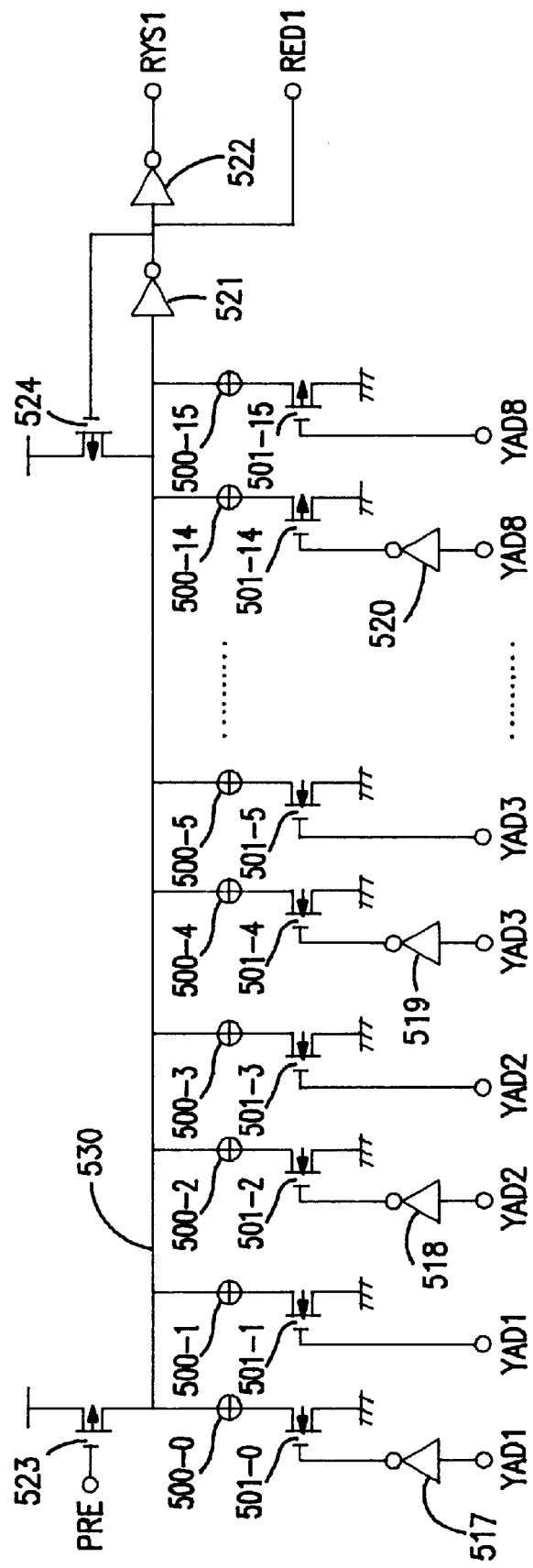
FIG. 17 is a circuit diagram illustrative of the odd address redundancy decoder 113.

FIG. 17 is a circuit diagram illustrative of the odd address redundancy decoder 113. The further address to be concurrently read out is different depending upon the burst length and generated by the combination with the above address signal. Namely, logic bits corresponding to the odd addresses YAD1 and YAD2 are always the same as the column addresses YAD1 and YAD2. The judgement of the substituting address is made in accordance with the address signals YAD1 and YAD2. Fuse elements 500-0 through 500-15 are cut by a laser trimming so that the substituting addresses are programmed. The fuse elements 500-0 through 500-15 are connected respectively to drains of n-channel transistors 501-0 through 501-15 whose gates are applied with respective address signals or inverted signals thereof. If, for example, the address corresponding to the substituting address YAD1 is "1", then fuse 500-1 is cut and if this address is "0", then the fuse 500-0 is cut for address programming.

Signal PRE is a pre-charge signal generated by the clock generator 107 in accordance with the variation of internal address signal. The signal PRE is activated into low level "0" to turn the p-channel MOS transistor 523 ON for judgement of the substituting address in response to the newly inputted column address signals YAD0–YAD8.

If the address signals YAD1–YAD8 inputted into the odd address redundancy decoder 113 correspond to the substituting address, then the fuses corresponding to the respective address bit logic have been cut, for which reason a current path for discharging the node 530 is in OFF. In accordance with the signal PRE, the node 530 is then charged into high level whilst the signal RED1 for inhibiting the selection of the column selective line is in low level and further the redundancy column selective line RYS1 for selecting the redundancy cells is in high level.

On the other hand, no correspondence is confirmed, then since any of the fuses corresponding to the address bits, the current path for discharging the node 530 is in ON. The signal PRE is unable to charge the node 530 and the node 530 remains low level. The signal RED1 for inhibiting the selection of the column selective line is in high level and further the redundancy column selective line RYS1 for selecting the redundancy cells is in low level.

Figure 18:
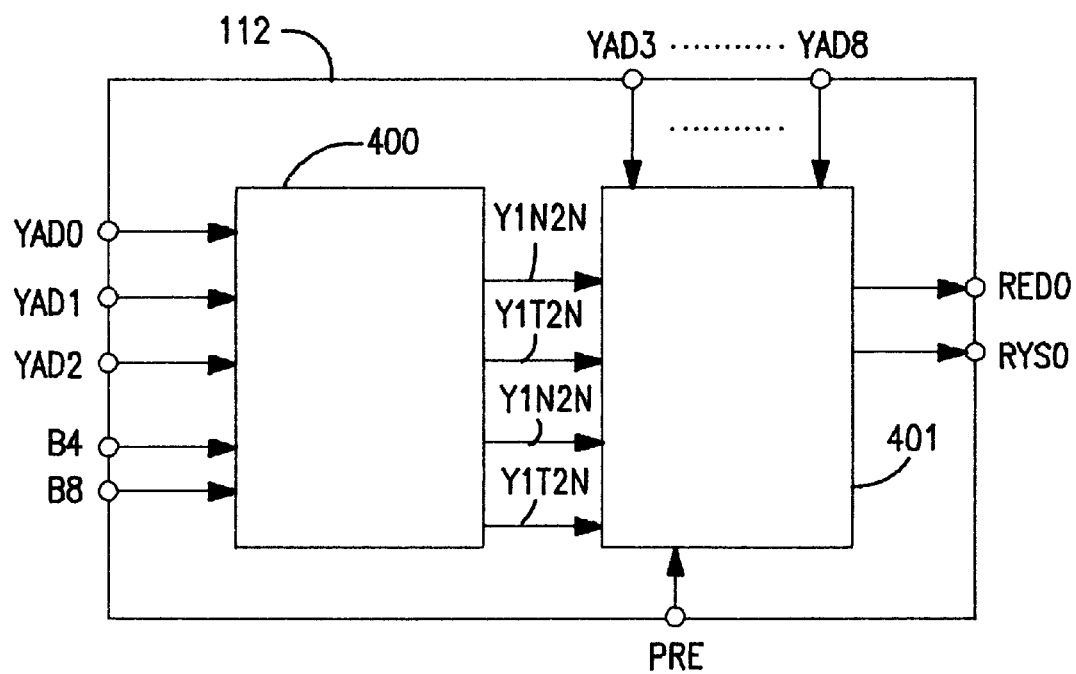
FIG. 18 is a circuit diagram illustrative of the even address decoder 112 in this embodiment.

FIG. 18 is a circuit diagram illustrative of the even address decoder 112 in this embodiment. The even address decoder 112 includes an address signal converter 400 and a fuse circuit section 401. In order to judge of the substituting address, the logic of the bits corresponding to the even addresses YAD1 sand YAD2 are converted depending upon the even or odd address or depending upon both the logic of the YAD0 and the burst signals B4 and B8.

The address converter 400 is to convert the above conversion. Output terminals Y1N2N, Y1T2N, Y1N2T, Y1T2T provide current paths for discharge to the fuse circuit 401 when the logics of the addresses corresponding to the substituting addresses YAD1 and YAD2 are (0,0), (1,0), (0,1) and (1,1).

The fuse circuit 401 is provided for programming to the terminals Y1N2N, Y1T2N, Y1N2T, Y1T2T and the YAD3–YAD8 of the higher bits of the column address.

Figure 19:
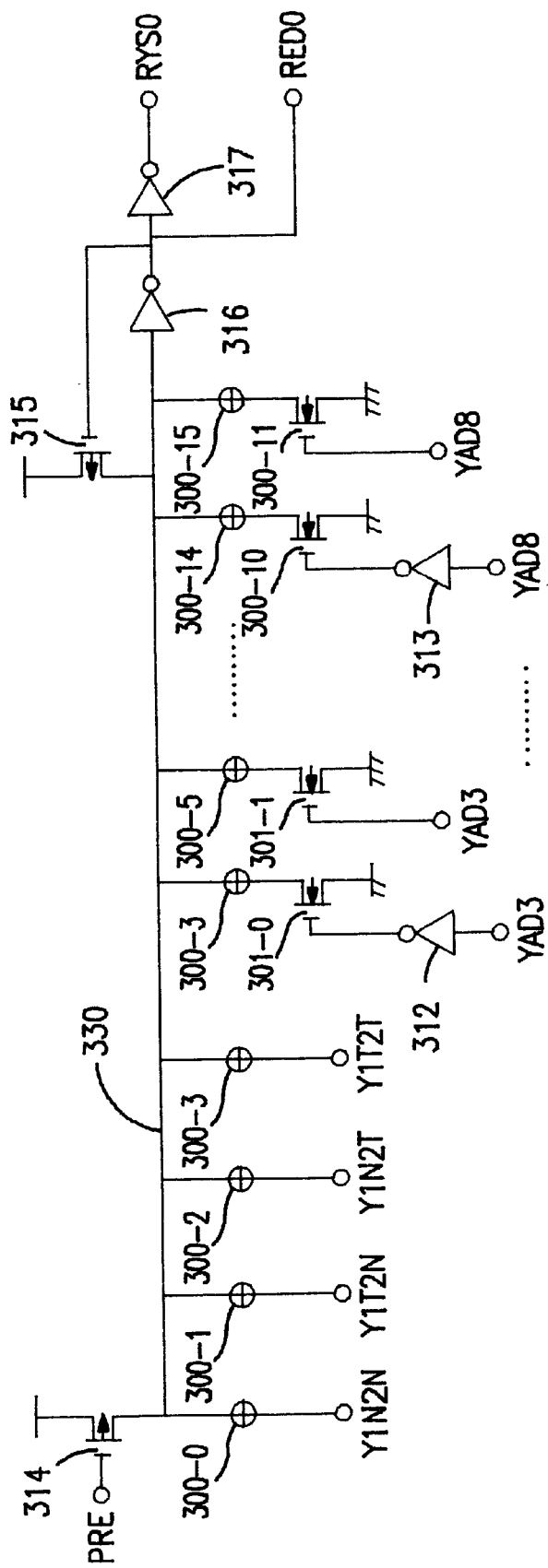
FIG. 19 is a circuit diagram illustrative of a circuit configuration of the fuse circuit 401.

FIG. 19 is a circuit diagram illustrative of a circuit configuration of the fuse circuit 401. The fuse circuit 401 includes fuse elements 300-0 through 300-15 which may be cut by a laser programming for programming the substituting address. The fuses 300-4 through 300-15 are for programming the YAD3–YAD8 as the higher bits of the column address.

The fuses 300-0 through 300-15 are respectively connected to drains of the n-channel MOS transistors 301-0 through 301-11 whose gates are applied with respective address signals or inverted signals thereof If, for example, the address signal corresponding to the substituting address YAD3 is "1", then the fuse 300-5 is cut. If the address signal corresponding to the substituting address YAD3 is "0", then the fuse 300-4 is cut. The addresses YAD4 through YAD8 are programmed in the same manners.

The fuses 300-0 through 300-3 are for programming the lower bits YAD1 and YAD2 of the column address.

The fuses 300-0 through 300-3 are connected to the terminals Y1N2N, Y1T2N, Y1N2T, Y1T2T. When the address logic combinations corresponding to the substituting addresses YAD1 and YAD2 are (0,0), (0,1), (1,0) and (1,1), then except for the fuse with the correspondence, the remaining fuses are cut.

Operations of the fuse circuit 401 are the same as the odd address redundancy decoder 113. When the inputted address signals correspond to the substituting address, then since the fuses corresponding to the respective address bit logic are cut, the current path for discharging the node 330 is in OFF. In accordance with the signal PRE, the node 330 is charged into high level so that the signal RED0 inhibiting the selection of the column selective line becomes low level whilst the redundancy column selective line RYS0 selecting the redundancy cells becomes high level.

If no correspondence appears between the input address signals and the substituting address, any of the fuses corresponding to the address bits is not cut. Namely, the current path for discharging the node 330 is in ON The signal PRE is unable to charge the node 330. Then, the node 330 remains low level. The signal RED0 inhibiting the selection of the column selective line becomes high level whilst the redundancy column selective line RYS0 selecting the redundancy cells becomes low level.

Figure 20:
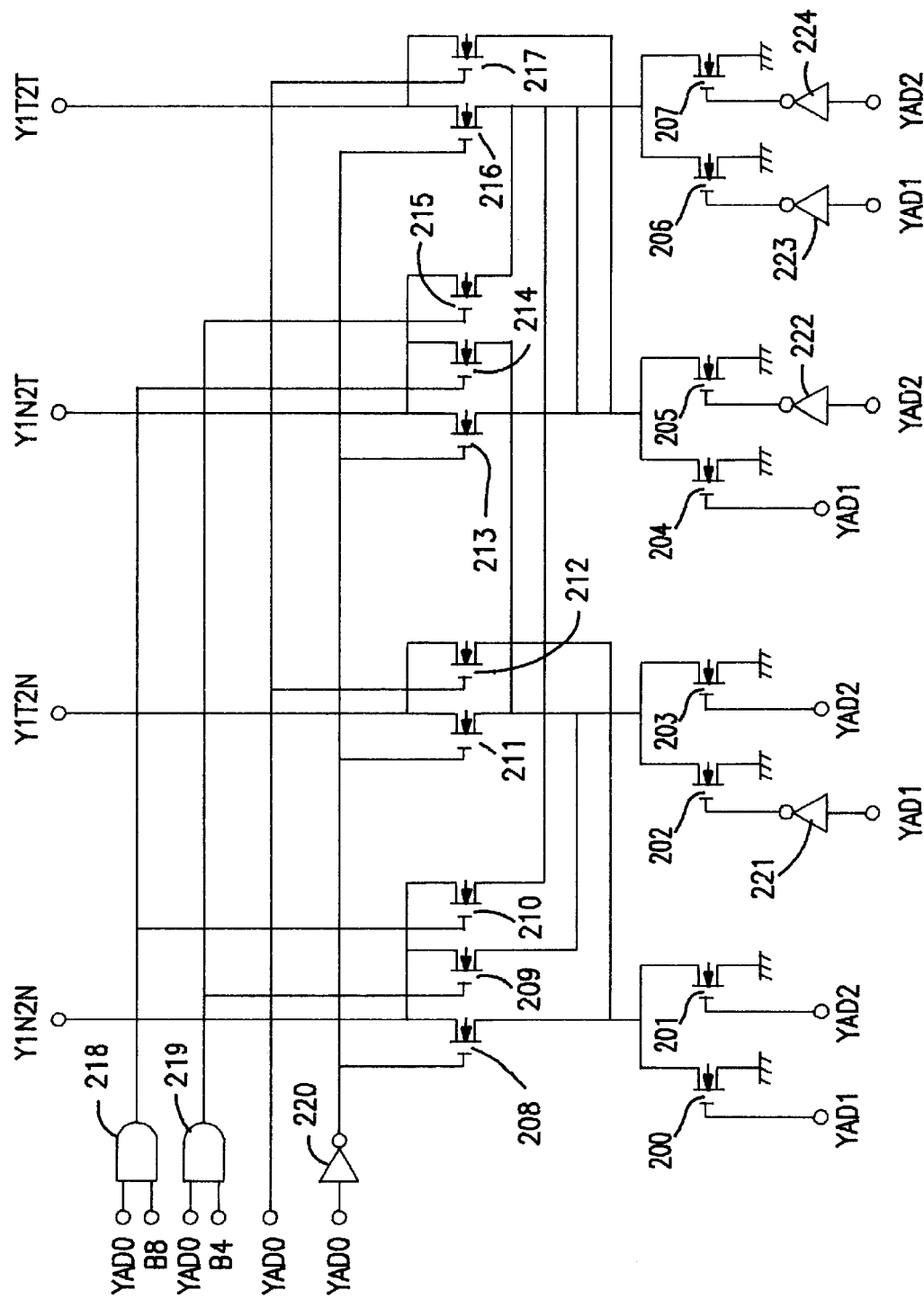
FIG. 20 is a circuit diagram illustrative of an address signal converter 400 in the even address redundancy decoder 112.

FIG. 20 is a circuit diagram illustrative of an address signal converter 400 in the even address redundancy decoder 112. The address signal converter 400 receives inputs of the signals YAD0–YAD2 and B4 and B8 to output Y1N2N, Y1T2N, Y1N2T and Y1T2T. The address signal converter 400 includes n-channel MOS transistors 200–217

Operations of the address signal converter 400 and the fuse circuit 401 will be described assuming that logics corresponding to the substituting addresses YAD1 and YAD2 are (0,0).

In the fuse circuit 401, the fuses 300-1 through 300-3 are cut and only the fuse 300-0 provides a current path for discharging the node 330.

When the supplied column address is the even address, then YAD0 is "0". The inverter 220 outputs "1" whereby the n-channel MOS transistor 208 whose gate is applied with the output "1" from the inverter 220 turns ON whilst the n-channel MOS transistors 209 and 210 remain OFF.

Since when the even address is supplied, logics of the bits corresponding to the YAD1 and YAD2 are the same as the supplied column address YAD1 and YAD2, then the logic of the YAD1 and YAD2 are (0,0) whereby the n-channel MOS transistors 200 and 201 turn OFF so that the discharge current path is in OFF. As a result, the address supplied is judged to be substituted. In case of the burst length of 2, the YAD0 remains fixed at "0".

When the burst length is 4 and the column address is odd address, YAD0 is "1"B4 is "1" and B8 is "0", for which reason the AND-gate 219 receiving the YAD0 and B4 outputs "1" whereby the n-channel MOS transistor 209 turns ON whilst the n-channel MOS transistors 208 and 210 remain OFF.

When the supplied column addresses YAD2, YAD1 and YAD0 are "0", "1" and "1" (=3), then logics of the bits corresponding to the even address YAD1 and YAD2 are (0,0).

In the above case, the n-channel MOS transistors 202 and 203 turn OFF whereby the discharge current path is in OFF. As a result, tile address is judged to be substituted.

When the burst length is 8 and the column address is odd address, YAD0 is "1", B4 is "0" and B8 is "1", for which reason the AND-gate 218 receiving the YAD0 and B8 outputs "1" whereby the n-channel MOS transistor 210 turns ON whilst the n-channel MOS transistors 208 and 209 remain OFF.

When the supplied column addresses YAD2, YAD1 and YAD0 are "1", "1" and "1" (=7), then logics of the bits corresponding to the even address YAD1 and YAD2 are (0,0).

In the above case, the n-channel MOS transistors 206 and 207 turn OFF whereby the discharge current path is in OFF. As a result, the address is judged to be substituted.

Figure 21:
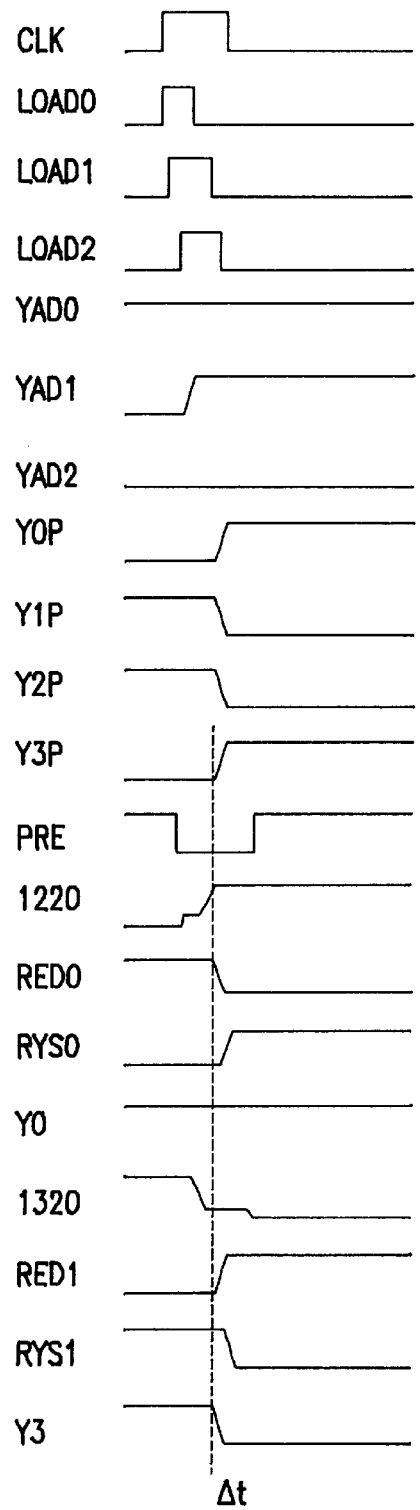
FIG. 21 is a timing chart of pre-decode pre-address and pre-decode address for selection of the column selective line, provided that the input addresses A2, A1 and A0 are "0", "1" and "1" and the burst length is 4.

FIG. 21 is a timing chart of pre-de code pre-address and pre-decode address for selection of the column selective line, provided that the input addresses A2, A1 and A0 are "0", "1" and "1" and the burst length is 4.

When the pre-decode addresses YAD2, YAD1 and YAD0 are supplied, then the pre-decode pre-addresses Y3P and Y1P are "1" provided that the even address corresponding to Y0P is the substituting address whilst the odd address corresponding to Y0P is the address already substituted in the previous step by selecting the Y1P, and the odd address corresponding to the Y3p is not the substituting address.

The address signals YAD2, YAD1 and YAD0 are supplied to the even and odd redundancy decoders for judgements of the same to be substituted.

Figure 22:
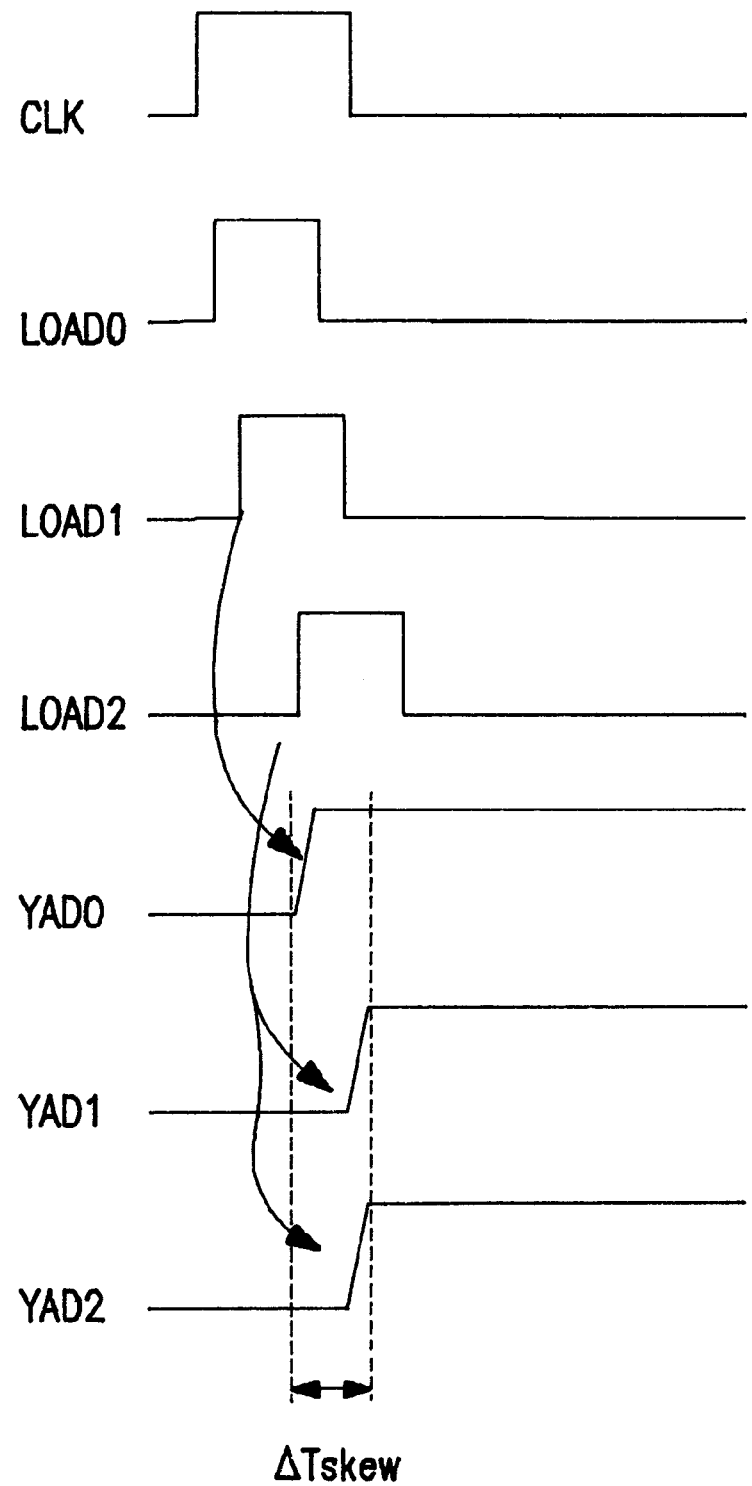
FIG. 22 is a timing chart of YAD0, YAD1 and YAD2.
Figure 23:
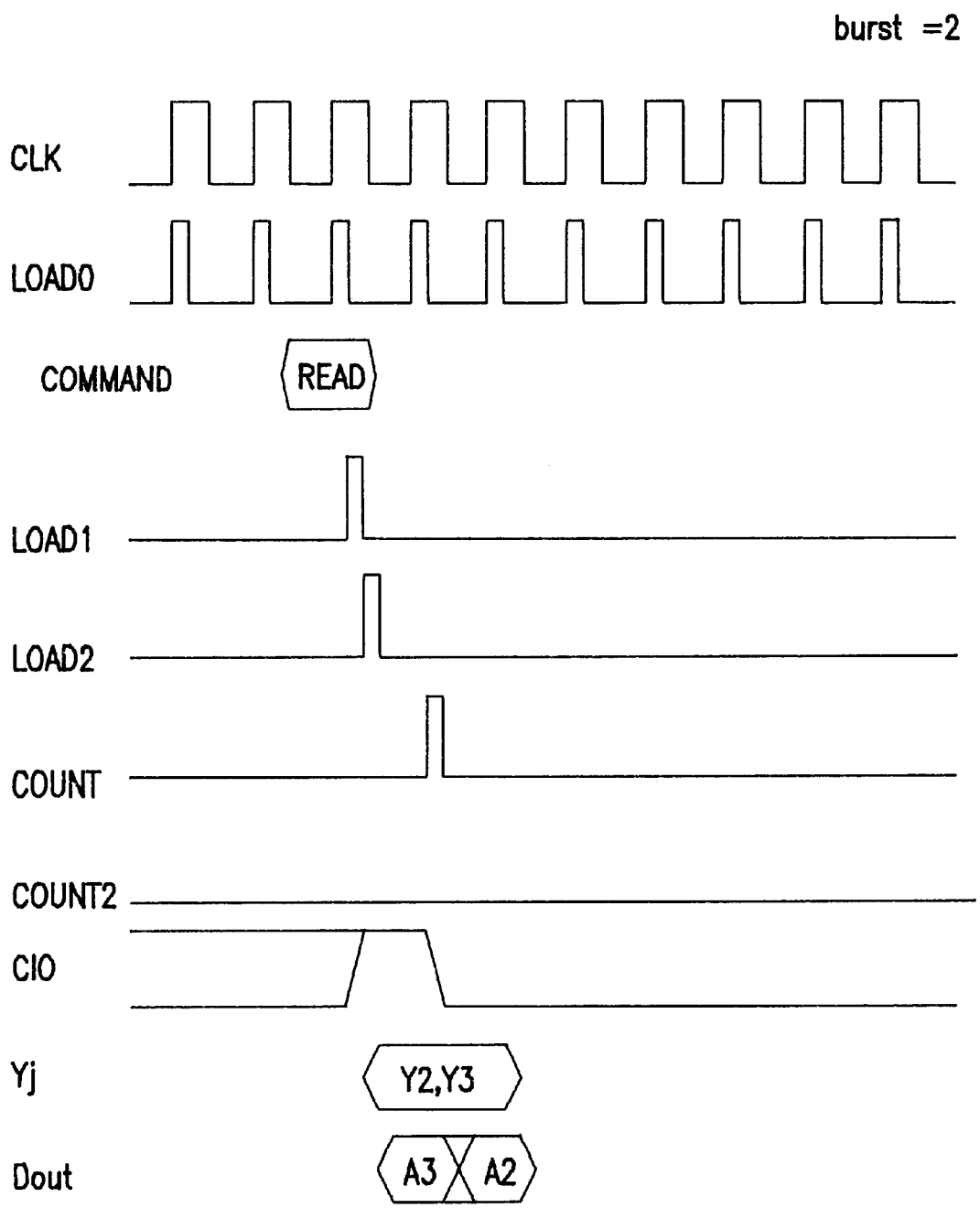
FIG. 23 is a timing chart of the conventional read-out operation when a burst length is 2.
Figure 24:
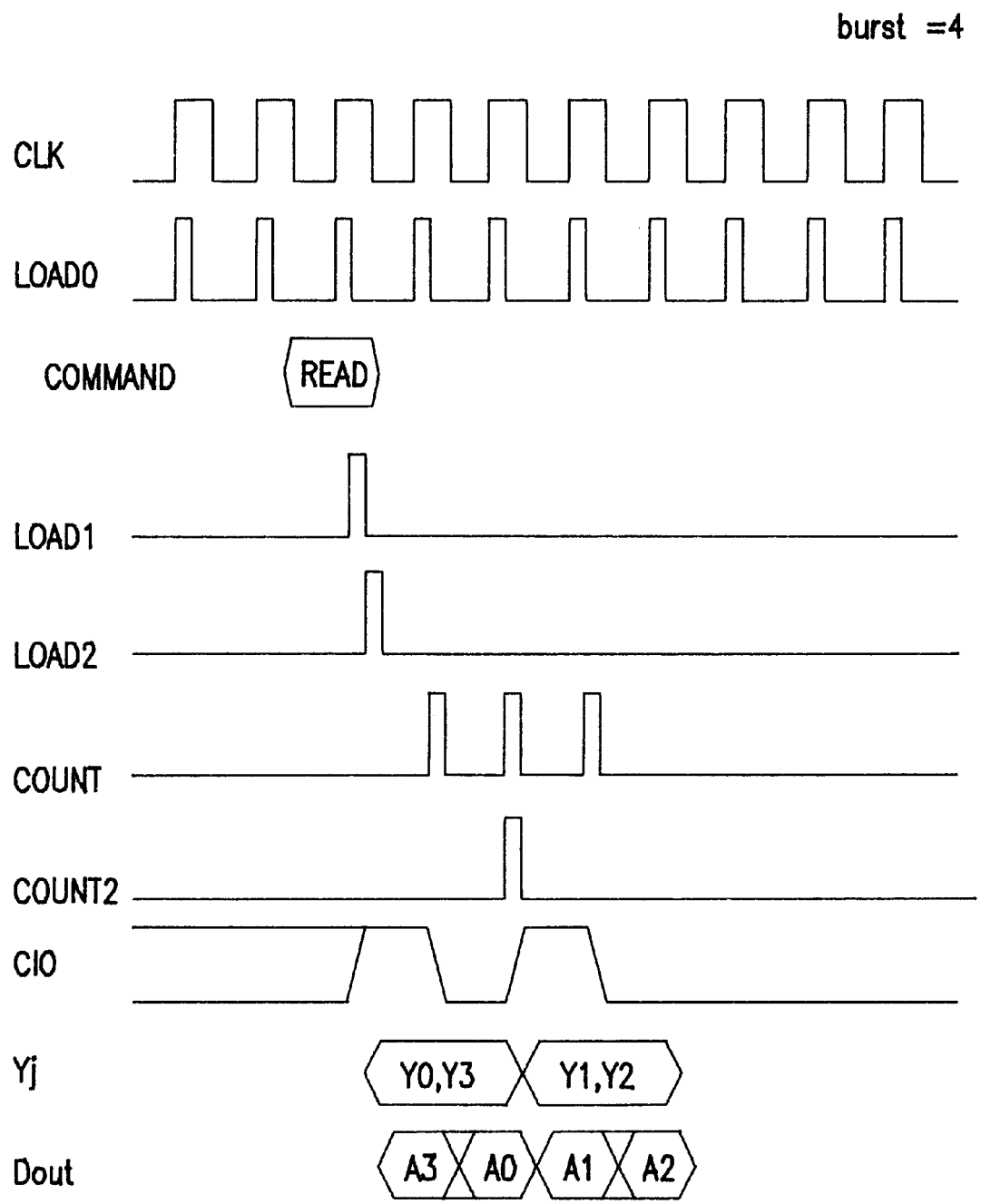
FIG. 24 is a timing chart of the conventional read-out operation when a burst length is 4.
Figure 25:
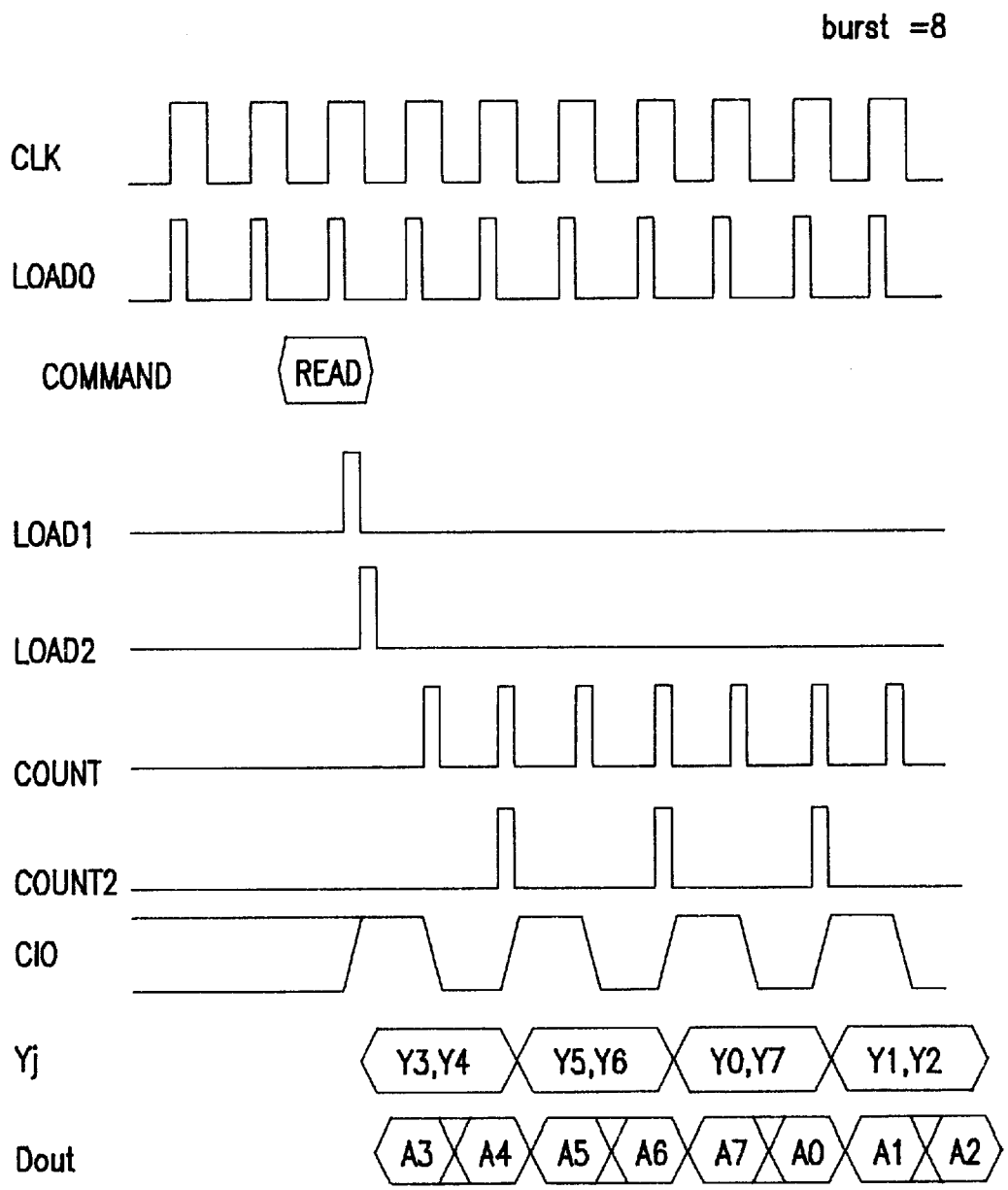
FIG. 25 is a timing chart of the conventional read-out operation when a burst length is 8.

FIG. 22 is a timing chart of YAD0, YAD1 and YAD2. YAD0 is supplied when the LOAD1 signal is generated. YAD1 is supplied after logic of the internal address signal IA1 was supplied from the latch circuit 601-1 into the latch circuit 602-1 in accordance with the LOAD1 signal generated.

There is a time difference between the YAD0 and YAD1 generations.

YAD2 is supplied in accordance with the generation of the LOAD2 at the same timing as the YAD1.

The timings of the generation of the pre-decode address and the judgement of the redundancy address are decided by the timings of supplying the YAD1 and YAD2.

If the address signals YAD2, YAD1 and YAD0 are supplied to the even address redundancy decoder 112, then the substituting address is judged whereby the inhibition signal RED0 for inhibiting the selection of the column selective line becomes "0". Y0P is inhibited from activation and remains "1".

When the address signals YAD2, YAD1, and YAD0 are supplied to the odd address redundancy decoder 113, then the substituting address is judged whereby the inhibition signal RED1 for inhibiting the selection of the column selective line becomes "1". Y3P is activated into "0".

Since the judgement signal is generated by the redundancy decoder in accordance with the address signals YAD0, YAD1 and YAD2, the timing of the generation of the judgement signals is almost the same as the timing of the generation of the pre-decode address whereby the time until the pre-decode signal for selecting the column selective line is decided is shortened for improvement in memory access speed.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention

What is claimed is:

1. A redundancy decoder circuit, comprising:

an address signal converter adjusted for receiving both an address signal of a first address, to which a first access should be made, and a burst length and for converting the address signal in accordance with the burst length; and a programmed circuit connected to said address signal converter for receiving said converted address signal from said address signal converter to carry out programming in accordance with said address signal so as to judge whether or not a further address is to be substituted.

2. The redundancy decoder circuit as claimed in claim 1, wherein said address signal converter converts logic combinations of lower bits of the addresses in accordance with the burst length.

3. The redundancy decoder circuit as claimed in claim 1, wherein said address signal converter receives even address signals.

4. The redundancy decoder circuit as claimed in claim 1, wherein said address signal converter receives odd address signals.

5. A redundancy decoder circuit, comprising:

means adjusted for receiving both an address signal of a first address, to which a first access should be made, and a burst length and for converting the address signal in accordance with the burst length; and a programmed circuit connected to said means for receiving said converted address signal from said means to carry out programming in accordance with said address signal so as to judge whether or not a further address is to be substituted.

6. The redundancy decoder circuit as claimed in claim 5, wherein said means comprises an address signal converter which converts logic combinations of lower bits of the addresses in accordance with the burst length.

7. The redundancy decoder circuit as claimed in claim 6, wherein said address signal converter receives even address signals.

8. The redundancy decoder circuit as claimed in claim 6, wherein said address signal converter receives odd address signals.

* * * * *